(12) United States Patent
Talwar et al.

(10) Patent No.: US 7,098,155 B2
(45) Date of Patent: Aug. 29, 2006

(54) LASER THERMAL ANNEALING OF LIGHTLY DOPED SILICON SUBSTRATES

(75) Inventors: Somit Talwar, Los Gatos, CA (US); David A. Markle, Saratoga, CA (US)

(73) Assignee: Ultratech, Inc., San Jose, CA (US)

( * ) Notice: Subject to any disclaimer, the term of this patent is extended or adjusted under 35 U.S.C. 154(b) by 191 days.

(21) Appl. No.: 10/762,861

(22) Filed: Jan. 22, 2004

(65) Prior Publication Data

US 2005/0103998 A1 May 19, 2005

Related U.S. Application Data

(63) Continuation-in-part of application No. 10/674,106, filed on Sep. 29, 2003.

(51) Int. Cl.
*H01L 21/324* (2006.01)
(52) U.S. Cl. .................. 438/795; 216/121; 216/65
(58) Field of Classification Search ................ 438/795, 438/799; 219/121.65, 121.74
See application file for complete search history.

(56) References Cited

U.S. PATENT DOCUMENTS

| 4,356,375 A | 10/1982 | Josephy et al. ....... 219/121 LH |
| 4,734,912 A | 3/1988 | Scerbak et al. ............. 372/27 |
| 4,761,786 A | 8/1988 | Baer ........................... 372/10 |
| 4,908,493 A | 3/1990 | Susemihl ............... 219/121.67 |
| 5,057,664 A | 10/1991 | Johnson et al. ....... 219/121.69 |
| 6,208,673 B1 | 3/2001 | Miyake ....................... 372/22 |
| 6,366,308 B1 | 4/2002 | Hawryluk et al. ......... 347/256 |
| 6,747,245 B1 | 6/2004 | Talwar et al. ............ 219/121.8 |
| 2004/0188396 A1* | 9/2004 | Talwar et al. .......... 219/121.65 |

OTHER PUBLICATIONS

Naem, Boothroyd, Calder, *CW Laser Annealed Small-Geometry NMOS Transistors*, Mat. Res. Soc. Symp. Proc. vol. 23 (1984) pp. 229-234.
Goetzlich, Tsien, Ryssel, *Relaxation Behavior of Metastable AS and P Concentrations in SI After Pulsed and CW Laser Annealing*, Mat. Res. Soc. Symp. Proc. vol. 23 (1984) pp. 235-240.

* cited by examiner

*Primary Examiner*—Tuan H. Nguyen
(74) *Attorney, Agent, or Firm*—Allston L. Jones

(57) ABSTRACT

Apparatus and method for performing laser thermal annealing (LTA) of a substrate using an annealing radiation beam that is not substantially absorbed in the substrate at room temperature. The method takes advantage of the fact that the absorption of long wavelength radiation (1 micron or greater) in some substrates, such as undoped silicon substrates, is a strong function of temperature. The method includes heating the substrate to a critical temperature where the absorption of long-wavelength annealing radiation is substantial, and then irradiating the substrate with the annealing radiation to generate a temperature capable of annealing the substrate.

8 Claims, 22 Drawing Sheets

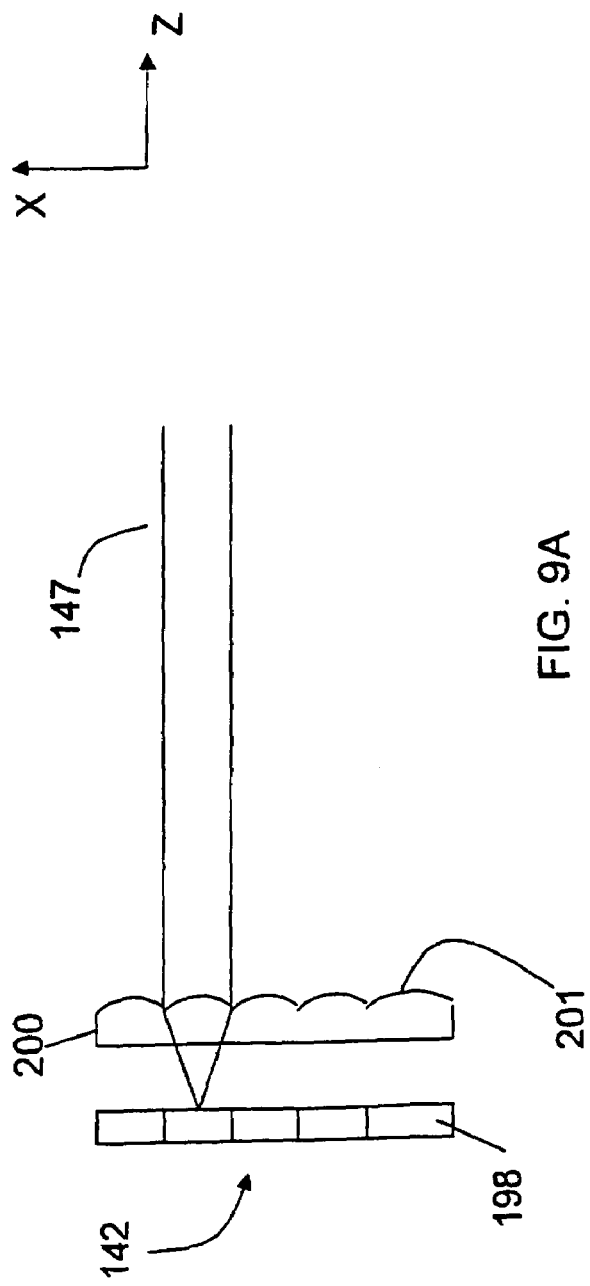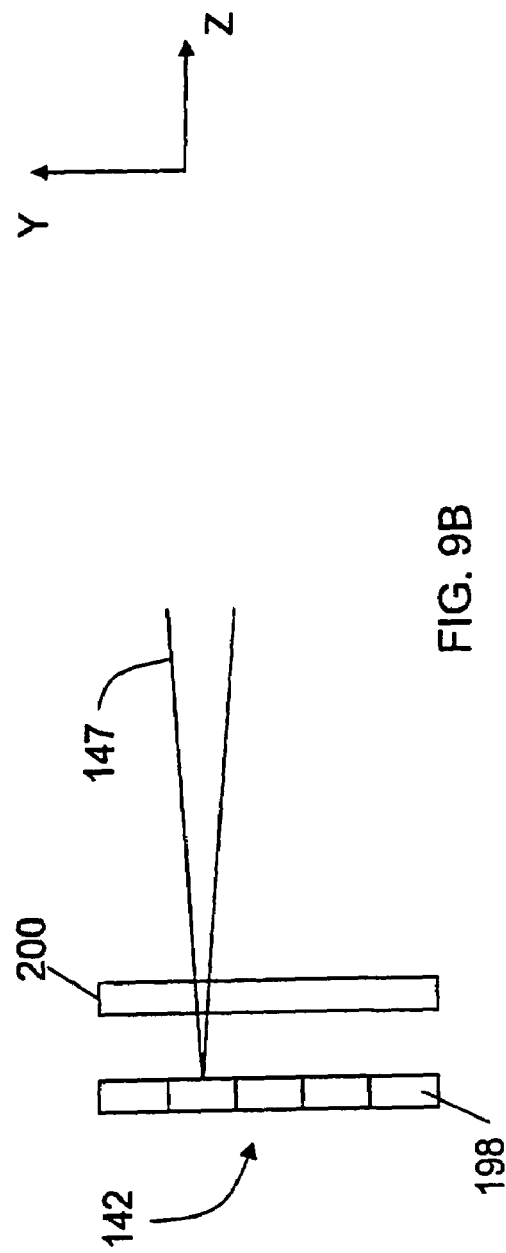

LASER THERMAL ANNEALING OF LIGHTLY DOPED SILICON SUBSTRATES

CROSS-REFERENCE TO RELATED APPLICATIONS

This application is a Continuation-In-Part of U.S. patent application Ser. No. 10/674,106, filed on Sep. 29, 2003.

BACKGROUND OF THE INVENTION

1. Field of the Invention

The present invention relates to laser thermal annealing, and in particular relates to apparatus and methods for performing laser thermal annealing of substrates that do not efficiently absorb the annealing radiation beam at ambient temperatures.

2. Description of the Prior Art

Laser thermal annealing or LTA (also referred to as "laser thermal processing") is a technique used to quickly raise and lower the temperature of the surface of a substrate to produce a change in properties. An example might include annealing and/or activating dopants in the source, drain or gate regions of transistors used to form integrated devices or circuits. LTA can also be used to form silicide regions in integrated devices or circuits, to lower poly-silicon runner resistances, or to trigger a chemical reaction to either form or remove substances from a substrate (or wafer).

LTA offers the possibility of speeding up the annealing cycle by a factor of 1000 over conventional annealing techniques, thereby virtually eliminating diffusion of dopant impurities during the annealing or activation cycle used on silicon wafers. The result is a more abrupt dopant profile and, in some cases, a higher level of activation. This translates into higher-performance (e.g., faster) integrated circuits.

U.S. patent application Ser. No. 10/287,864 discloses performing LTA of doped silicon substrates using $CO_2$ laser radiation. The laser radiation is focused into a narrow line, which is scanned at constant velocity in a raster pattern across the substrate. However, this approach works well only on relatively heavily doped substrates (i.e., a dopant concentration of about $3 \times 10^{17}$ atoms/cm$^3$ or greater), where the absorption length of the laser radiation in the doped silicon is less than or roughly comparable to the thermal diffusion length. Conversely, for lightly doped substrates (i.e., a dopant concentration of about $1 \times 10^{16}$ atoms/cm$^3$ or less), the $CO_2$ laser radiation passes through the substrate without imparting appreciable energy to the substrate.

What is needed therefore is way to efficiently perform LTA of lightly doped silicon substrates using radiation that otherwise passes through the substrate without heating, such as $CO_2$ laser radiation having a wavelength of 10.6 µm.

SUMMARY OF THE INVENTION

A first aspect of the invention is an apparatus for performing laser thermal annealing of a substrate having a surface. The apparatus includes a laser capable of generating continuous annealing radiation having a wavelength that is not substantially absorbed by the substrate at room temperature. The apparatus also includes an annealing optical system adapted to receive the annealing radiation and form an annealing radiation beam that forms a first image at the substrate surface, and wherein the first image is scanned across the substrate surface. The apparatus further includes a heating device for heating at least a portion of the substrate to a critical temperature such that the annealing radiation beam incident upon the heated portion is substantially absorbed near the surface of the substrate during scanning. In an example embodiment heating a portion of the substrate can be done using a short-wavelength laser diode beam that immediately precedes the long-wavelength annealing beam.

A second aspect of the invention is a method of laser thermal annealing a substrate. The method includes providing an annealing radiation beam from a laser having a wavelength that at room temperature is not substantially absorbed by the substrate, and heating at least a portion of the substrate to a critical temperature such that the annealing radiation beam is capable of being substantially absorbed near the surface of the substrate at said heated portion. The method also includes initiating a self-sustaining annealing condition by heating a portion of the substrate surface immediately in advance of scanning the annealing radiation beam over the substrate.

BRIEF DESCRIPTION OF THE DRAWINGS

FIG. 9A is a close-up cross-sectional view in the X-Z plane of the heating radiation source and the cylindrical lens array;

FIG. 9B is a close-up cross-sectional view in the Y-Z plane of the heating radiation source and the cylindrical lens array;

Figure 1A:
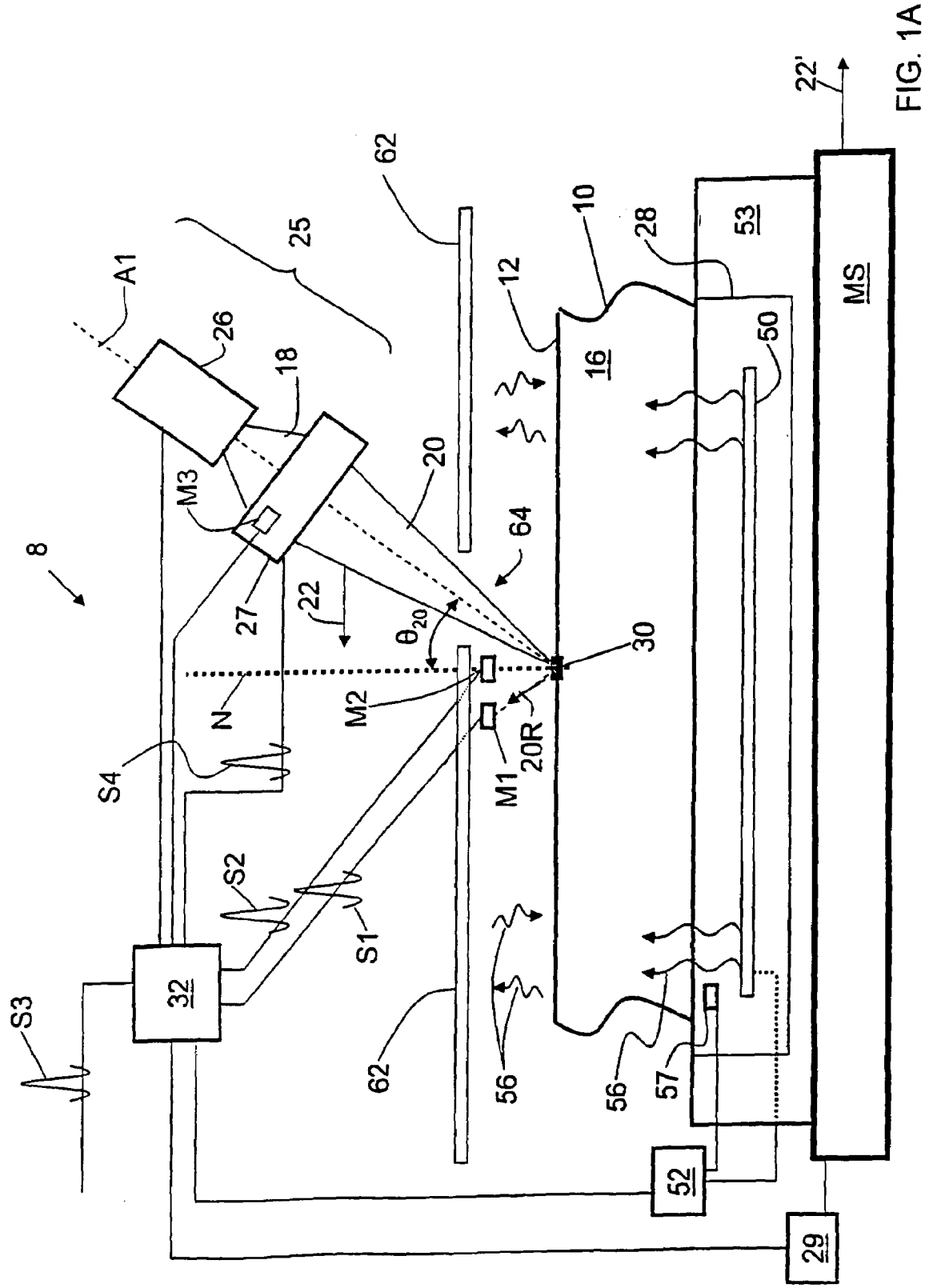
FIG. 1A is a cross-sectional view of an example embodiment of the LTA apparatus of the present invention that includes an LTA optical system along with a silicon substrate being processed by the system, wherein the LTA apparatus includes a heated chuck to support and pre-heat the substrate, and an optional heat shield surrounding the chuck to reduce radiation coupling to the rest of the apparatus and to promote efficient substrate heating.

The various elements depicted in the drawings are merely representational and are not necessarily drawn to scale. Certain proportions thereof may be exaggerated, while others may be minimized. The drawings are intended to illustrate various implementations of the invention, which can be understood and appropriately carried out by those of ordinary skill in the art.

DETAILED DESCRIPTION OF THE INVENTION

The present invention relates to laser thermal annealing (LTA) of substrates and in particular relates to apparatus and methods for performing LTA of lightly doped silicon wafers (substrates). The term "lightly doped" means herein a dopant concentration of about $10^{16}$ atoms/cm$^3$ or less. The dopant concentration in the substrate may be that associated with normal substrate production to achieve a desired resistivity level and substrate type (i.e., N-type or P-type).

In the description below, a generalized embodiment of the LTA apparatus of the present invention is described, along with a description of the "self-sustaining annealing condition" sought to be created by the present invention. This is followed by various example embodiments of the invention. The invention is further explained in connection with a number of different substrate temperature plots that illustrate key properties of the absorption of radiation by silicon substrates. Methods of determining the appropriate power level in the preheating radiation beam are then discussed, followed by an example of a heating lens used in an example embodiment to heat the substrate with a preheating radiation beam. The preferred scanning and orientation of the preheating and annealing radiation beams are then described in detail.

I. Generalized LTA Apparatus

FIG. 1A is a cross-sectional view of an embodiment of an LTA apparatus 8 of the present invention, along with a substrate 10 to be annealed. Substrate 10 has an upper surface 12 and a body (bulk) region 16 that is "undoped," or strictly speaking, more lightly doped than the very small junction regions or devices that typically contain very high doping levels only in an extremely shallow region. The reference letter N denotes the normal to substrate upper surface 12. In an example embodiment, substrate 10 is a silicon wafer.

LTA apparatus 8 includes an LTA optical system 25 having an annealing radiation source 26 and an LTA lens 27 arranged along an optical axis A1. Lens 27 receives continuous (i.e., non-pulsed) annealing radiation 18 from annealing radiation source 26 and creates a continuous annealing radiation beam 20 that forms an image 30 (e.g., a line image) at substrate surface 12. Annealing radiation beam 20 is incident upper surface 12 at an incident angle $\theta_{20}$ as measured relative to surface normal N and optical axis A1.

Arrow 22 indicates an example direction of motion of annealing radiation beam 20 relative to substrate surface 12. Substrate 10 is supported by a chuck 28, which in turn is supported by a movable stage MS operatively connected to a stage driver 29 that causes the stage (and hence the substrate) to move at select speeds and directions relative to annealing radiation beam 20 or some other reference. The scanning movement of movable stage MS is indicated by arrow 22'. In an example embodiment, stage MS is capable of moving in at least two dimensions.

In an example embodiment, LTA apparatus 8 includes a reflected radiation monitor M1 and a temperature monitor M2. Reflected radiation monitor M1 is arranged to receive radiation reflected from substrate surface 12, as indicated by radiation 20R. Temperature monitor M2 is arranged to measure the temperature of substrate surface 12, and in an example embodiment is arranged along the surface normal N to view the substrate at normal incidence at or near where image 30 is formed by annealing radiation beam 20. Monitors M1 and M2 are coupled to a controller (discussed immediately below) to provide for feedback control based on measurements of the amount of reflected radiation 20R and/or the measured temperature of substrate surface 12, as described in greater detail below.

In an example embodiment, LTA apparatus 8 further includes a controller 32 operatively connected to annealing radiation source 26, stage driver 29, monitors M1 and M2, as well as to an optional monitor M3 contained in lens 27 that serves as an incident power monitor. Controller 32 may be, for example, a microprocessor coupled to a memory, or a microcontroller, programmable logic array (PLA), field-programmable logic array (FPLA), programmed array logic (PAL) or other control device (not shown). The controller 32 can operate in two modes: 1) open-loop, wherein it maintains a constant power delivered to substrate 10 by annealing radiation beam 20 along with a constant scan rate via stage driver 29; and 2) closed-loop, wherein it maintains a constant maximum temperature on substrate surface 12 or a constant power absorbed in the substrate. The maximum substrate temperature varies directly with the absorbed power and inversely as the square root of the scan velocity.

In an example embodiment a closed loop control is used to maintain a constant ratio of absorbed power in annealing radiation beam 20 incident the substrate, to the square root of the scan velocity. i.e., if $P_{20}$ is the amount of power in annealing radiation beam 20 and $P_{30}$ is the reflected power then the absorbed power is $P_a = P_{20} - P_{30}$. If V is the scan velocity of substrate 10 relative to the annealing radiation beam, then the ratio $P_a/V^{1/2}$ is kept constant to maintain a constant temperature indirectly.

For closed loop operation based on a direct maximum temperature measurement, controller 32 receives a signal (e.g., an electrical signal), such as the maximum substrate temperature via signal S2 from temperature monitor M2 and controls either the incident power or the scan rate to maintain a constant maximum substrate temperature. The absorbed power $P_a$ is obtained by subtracting power $P_{30}$ in reflected annealing radiation beam 20R via signal S1 generated by reflected radiation monitor M1 from the incident power $P_I$ of annealing radiation beam 20 obtained from sampling a portion of the annealing radiation beam via signal S4.

Further, controller 32 is adapted to calculate parameters based on the received signals and input parameters (e.g., desired absorbed power level and dwell time). The controller 32 is also coupled to receive an external signal S3 from an operator or from a master controller (not shown) that is part of a larger assembly or processing tool. This parameter is indicative of the predetermined dose (amount) of annealing radiation 20 to be supplied to process the substrate or the maximum substrate temperature desired. The parameter signal(s) can also be indicative of the intensity, scan velocity, scan speed, and/or number of scans to be used to deliver a predetermined dose of annealing radiation 20 to substrate 10.

In an example embodiment, annealing radiation source 26 is a $CO_2$ laser so that annealing radiation beam 20 has a wavelength of 10.6 µm. In general, however, annealing radiation source 26 is any continuous radiation source that emits radiation having a wavelength not substantially absorbed by a substrate at room temperature, but is substantially absorbed by the same substrate when the substrate, or a sufficient portion of the top of the substrate, is at a higher temperature. In a preferred embodiment, annealing radiation source 26 is a laser.

LTA apparatus 8 is adapted to take advantage of the absorption of annealing radiation beam 20 near the top of the substrate to efficiently raise the temperature of the top of the substrate while leaving the temperature of the body of the substrate substantially unchanged. In other words, where the substrate is a semiconductor wafer, the present invention is directed to increasing the temperature of the wafer at or near the surface where devices (e.g., transistors) are formed, rather than to heating the wafer body.

At ambient temperatures, however, lightly doped and undoped substrates are difficult to anneal because long-wavelength radiation beams pass right through the substrate without heating the top surface appreciably. On the other hand, highly doped substrates are not difficult to anneal because the incident annealing radiation is absorbed in the first 100 microns or so of material and raises the temperature to the desired annealing temperature.

The body (bulk) 16 of substrate 10, which does not absorb appreciable radiation from the beam and is not heated, serves to quickly cool the top surface regions when the annealing radiation beam 20 is no longer applied to the substrate. The present invention takes advantage of the fact that absorption of radiation in lightly doped silicon at certain infrared wavelengths, such as the $CO_2$ laser wavelength of 10.6 µm, strongly depends on the substrate temperature. Once appreciable absorption of annealing radiation beam 20 occurs, the substrate surface temperature increases, which results in stronger absorption, which in turn results in stronger heating of the substrate surface, and so on.

II. The Self-Sustaining Annealing Condition

Figure 2:
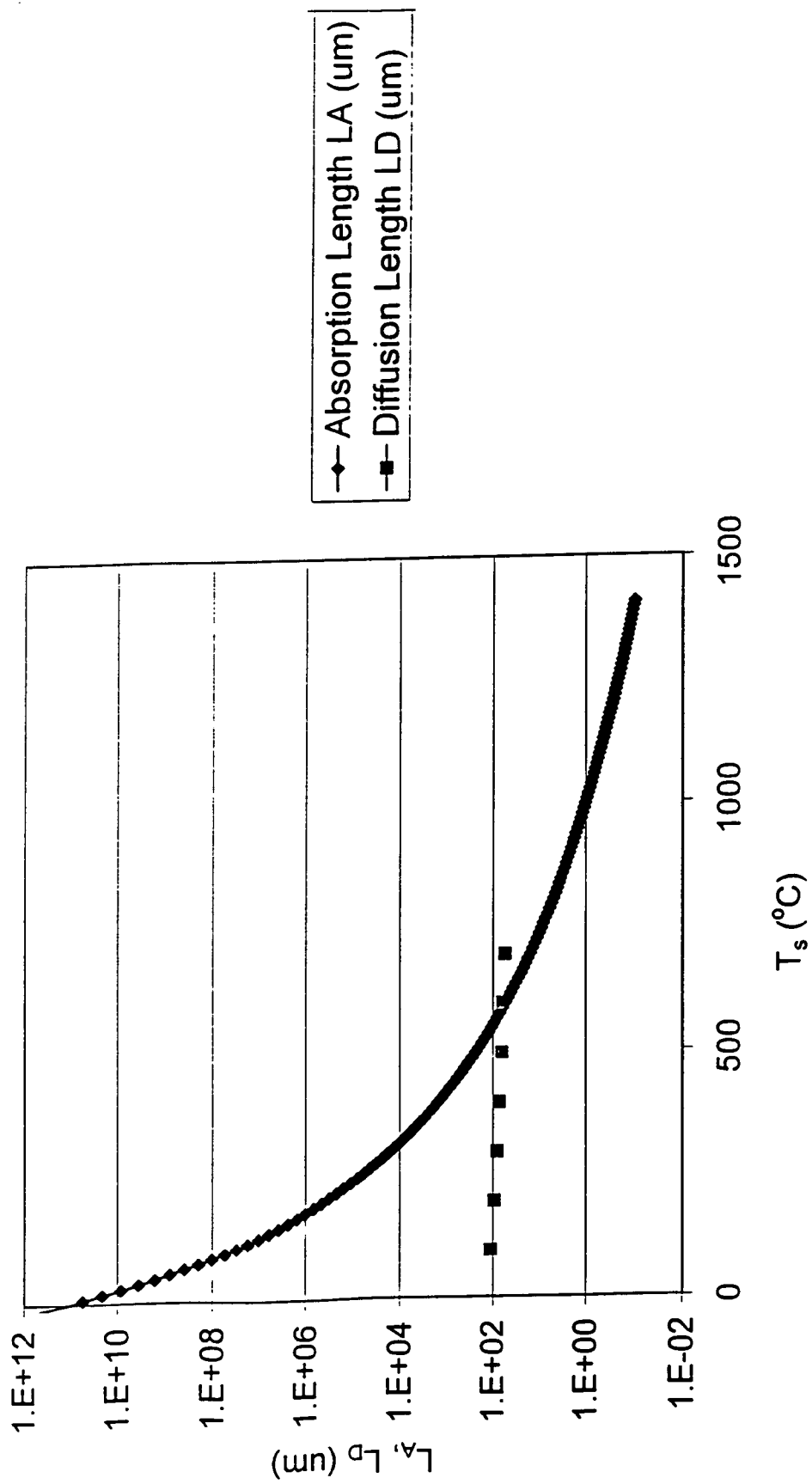
FIG. 2 is a plot of the absorption path length $L_A$ (µm) in an undoped silicon substrate versus the substrate temperature $T_S$ (° C.) for a 10.6 µm wavelength annealing radiation beam, along with a plot of the diffusion length $L_D$ associated with the radiation beam having a 200 µs dwell time, versus substrate temperature $T_S$ (° C.)

FIG. 2 is a plot of the absorption length $L_A$ (µm) (vertical axis) in a silicon substrate versus the substrate temperature $T_S$ (° C.) for 10.6 µm wavelength radiation. Also included in the plot are points for the diffusion length $L_D$ (µm) for a 200 µs dwell time also as a function of substrate temperature $T_S$. The absorption length $L_A$ is the thickness it takes to attenuate the intensity of the annealing radiation beam 20 by 1/e. The thermal diffusion length $L_D$ is the depth to which an instantaneous surface temperature rise will propagate into a material after a certain dwell time. Note that $L_A$ and $L_D$ have about the same value of ~60 µm at a temperature $T_S$~600° C.

The strong variation of absorption path length $L_A$ with substrate temperature $T_S$ creates two possible steady-state conditions, namely: (1) Annealing radiation beam 20 passes through the substrate without being substantially absorbed and thus does not produce substantial heating, or (2) annealing radiation beam 20 is substantially absorbed near substrate surface 12, thereby producing a "hot spot" at and just below the substrate surface corresponding to image 30 that travels with annealing radiation beam 20 as the beam moves (i.e., is scanned) over the substrate surface.

Figure 3:
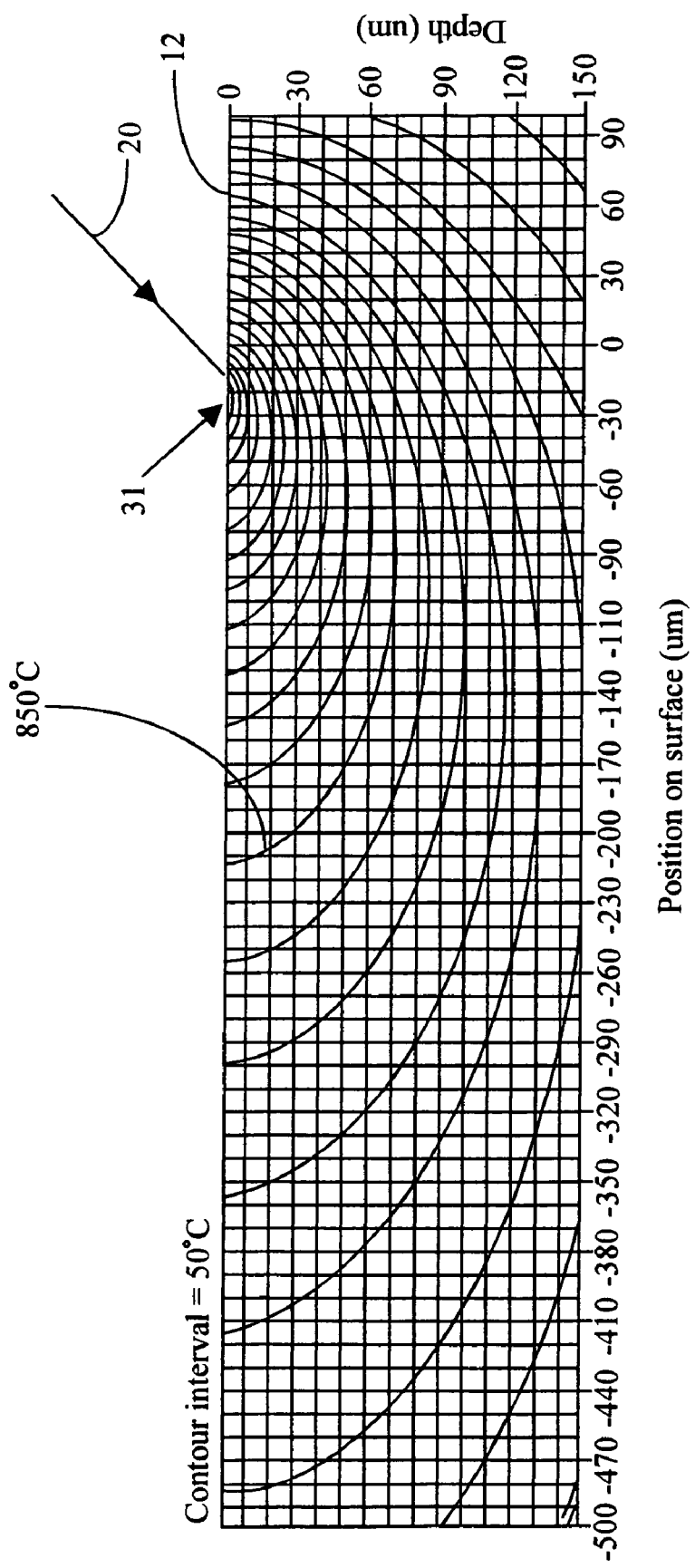
FIG. 3 is a computer simulation of the substrate temperature profile as a function of depth (µm) and annealing radiation beam position (µim) illustrating the "hot spot" formed in the substrate by the annealing radiation beam associated with the self-sustaining annealing condition.

FIG. 3 is a computer simulation of the substrate temperature (° C.) profile as a function of depth (µm) and annealing radiation beam position (µm). The temperature profile is the hot spot (denoted by 31), which travels within the substrate and across substrate surface 12. Traveling hot spot 31 serves to preheat the region of substrate 10 in front of the advancing image 30 by thermal diffusion (see FIG. 4B, discussed below). The substrate preheating associated with the propagation of hot spot 31 allows the radiation in annealing radiation beam 20 to be efficiently absorbed near upper surface 12 as the beams are scanned over the substrate surface. Steady-state condition (2) is the one sought to be created using apparatus 8 and the accompanying methods of the present invention, and is referred to herein as the "self-sustaining annealing condition."

The general method of creating a self-sustaining annealing condition according to the present invention includes heating substrate 10 (or select regions or portions thereof) to a critical temperature $T_C$ (e.g., 350° C. or greater, as discussed in more detail below) so that annealing radiation beam 20 is substantially absorbed by the substrate, i.e., is absorbed to the point wherein the self-sustaining annealing condition is initiated.

The precise value of $T_C$ depends on the temperature distribution within the substrate, its dopant concentration, and the annealing radiation beam intensity. Thus, in an example embodiment, the critical temperature $T_C$ is determined empirically. This may include, for example, measuring the maximum temperature produced by an annealing radiation beam for a test substrate having either a variety of initial temperature conditions or a constant initial temperature condition and a variety of annealing and preheating radiation beam intensities. The preheating of substrate 10 to give rise to the self-sustaining annealing condition can be accomplished in a number of ways. Several example embodiments of an LTA apparatus 8 that include heating devices for heating substrate 10 to practice the method of creating the self-sustaining annealing condition in lightly doped silicon substrates 10 for the purpose of performing LTA are set forth below.

III. Heated Chuck Embodiment with Optional Heat Shield

With reference again to FIG. 1A, in an example embodiment chuck 28 is thermally conductive and includes a heating element 50 connected to a power source 52, which in turn is connected to, and controlled by, controller 32. A thermal insulating layer 53 surrounds the bottom and sides of the chuck 28 to limit unwanted heating of the stage and the loss of heat from the chuck.

In operation, controller 32 activates power supply 52, which in turn supplies power to heating element 50. In response, heating element 50 generates heat 56. In an example embodiment, the amount of generated heat 56 is controlled by a temperature sensor 57 in the chuck and operatively connected to power supply 52 (or alternatively to controller 32) so that the chuck temperature is limited to a certain, predetermined, maximum value. Once the substrate is loaded onto the chuck its temperature quickly reaches the same temperature as the chuck. Typically, the chuck temperature $T_{CH}$ is about 400° C.

In another example embodiment, apparatus 8 also optionally includes a heat shield 62 supported above substrate 12 so as to reflect heat 56 back to the substrate. This results in more uniform heating of the substrate and less heating of the apparatus components on the opposite side of the shield. In an example embodiment, heat shield 62 is a gold-coated glass plate. Heat shield 62 includes an aperture 64 that allows annealing radiation beam 20 to reach surface 12 of substrate 10.

IV. Heated Enclosure Embodiment

Figure 1B:
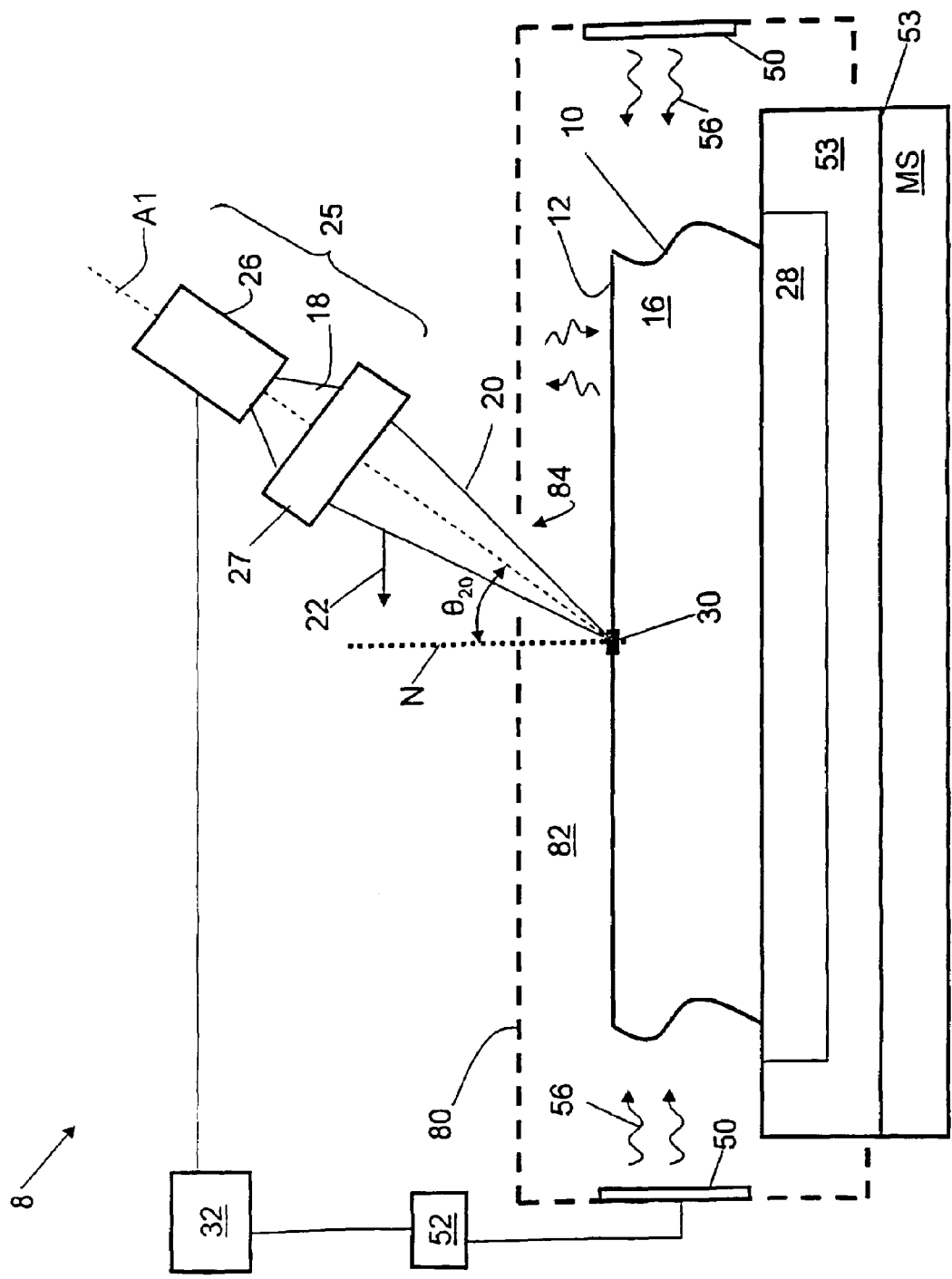
FIG. 1B is a cross-sectional view of an embodiment of the LTA apparatus of the present invention similar to that shown in FIG. 1A, that includes a heated enclosure surrounding the substrate for pre-heating the substrate.

With reference to FIG. 1B, in another example embodiment, apparatus 8 includes a heated enclosure 80 (e.g., an oven) having an interior region 82 large enough to enclose both substrate 10 and chuck 28 or the substrate, chuck and stage MS. Enclosure 80 includes additional heating elements 50 (preferably in addition to the one included in chuck 28) connected to power source 52. Power source 52 is connected to controller 32. In an example embodiment, enclosure 80 includes a window or aperture 84 that allows annealing radiation beam 20 to reach surface 12 of substrate 10. Thermal insulating layer 53, discussed above in connection with FIG. 1A, is preferably present on the sides and bottom of the chuck to limit unwanted loss of heat from the chuck to the stage.

In operation, controller 32 activates power supply 52, which in turn supplies power to heating elements 50. In response, heating elements 50 generate heat 56, thereby raising the temperature of the chuck, the substrate and the immediate surroundings to a maximum critical temperature $T_C$ of about 400° C. Enclosure 80 is preferably thermally insulated so that heat 56 remains trapped within interior region 82, thereby promoting efficient and uniform heating of the substrate.

V. Preheating Radiation Beam Embodiment

Figure 1C:
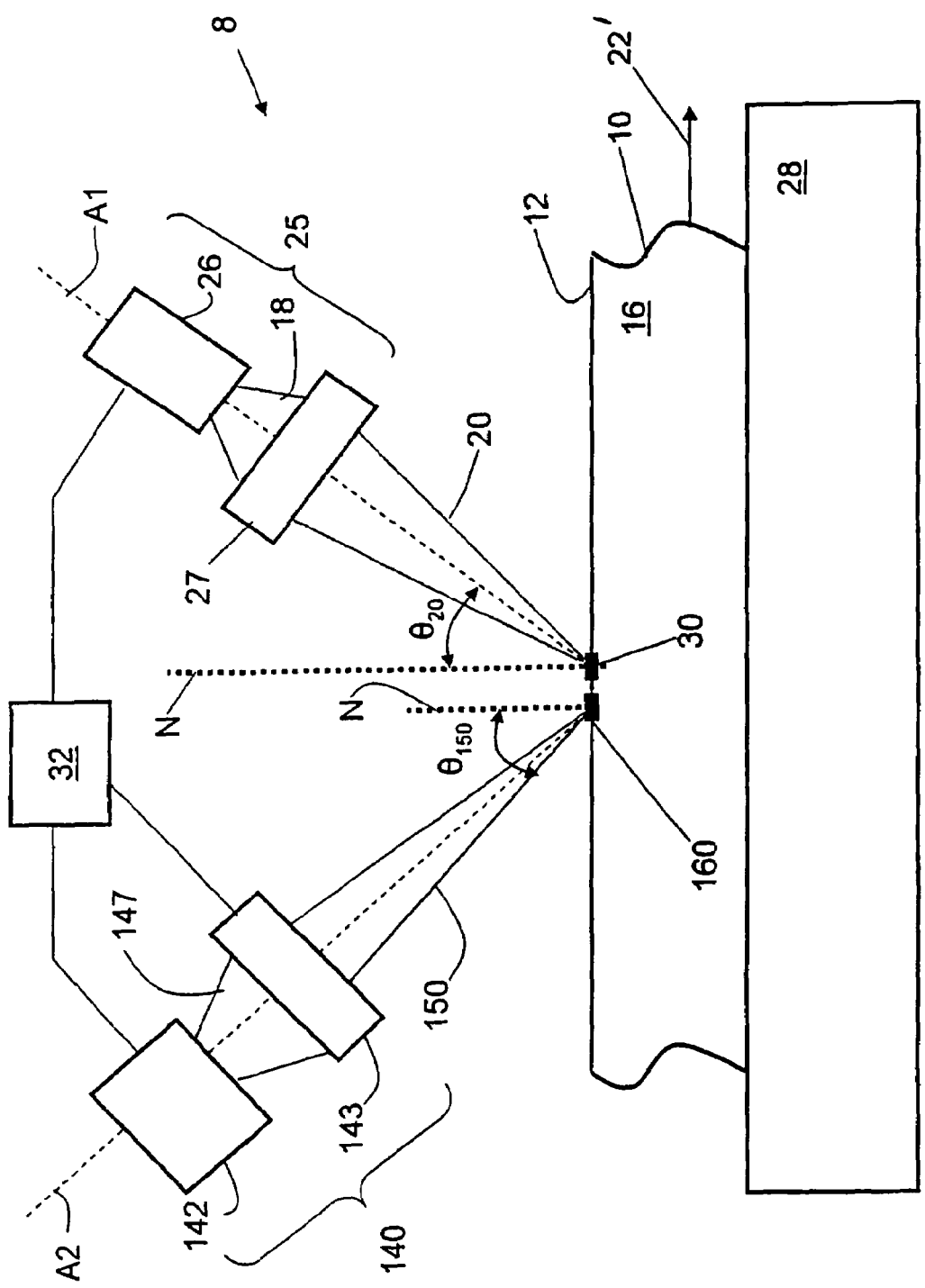
FIG. 1C is a cross-sectional view of an embodiment of the LTA apparatus of the present invention similar to that shown in FIG. 1A, wherein the heated chuck and optional heat shield are replaced by an optical heating system adapted to preheat at least a portion of the substrate using a preheating radiation beam.

With reference now to FIG. 1C, in another example embodiment, apparatus 8 includes a preheating optical relay system 140 having a preheating radiation source 142 and a relay lens 143 arranged along an optical axis A2. Preheating radiation source 142 is one that emits radiation 147 that is applied to relay lens 143 with preheating radiation beam 150 therefrom used to preheat the substrate just before it is heated by the annealing radiation beam. Radiation 147 has a wavelength that is readily (substantially) absorbed by 100 μm or less of silicon. In an example embodiment, preheating radiation source 142 is a laser diode array that emits preheating radiation 147 having a wavelength of 0.8 μm (800 nm) or 0.78 μm (780 nm). An example embodiment of relay lens 143 is described below. Preheating radiation source 142 and relay lens 143 are operably connected to controller 32, along with monitors M1 and M2, and stage driver 29 shown in FIG. 1A, and not shown in FIG. 1C for ease of illustration.

In operation, preheating radiation source 142 emits radiation 147, which is received by relay lens 143. Relay lens 143 creates a preheating radiation beam 150 that forms an image 160 (e.g., a line image) at substrate surface 12. Preheating radiation beam 150 is incident substrate surface 12 at an incident angle $\theta_{150}$ as measured relative to substrate surface normal N.

In one example embodiment, image 30 formed by annealing radiation beam 20 and image 160 formed by preheating radiation beam 150 are situated side-by-side on substrate surface 12, as shown in FIG. 1C. Thus, preheating radiation beam 150 acts to locally preheat the portion or region of the substrate just in front of the portion being irradiated by annealing radiation beam 20. Arrow 22' illustrates the movement of substrate 10 (e.g., via movable chuck 28; see FIG. 1), which in an example embodiment is moved under fixed radiation beams 20 and 150 (or equivalently, fixed images 30 and 160) to effectuate scanning of these beams (or images).

Figure 4A:
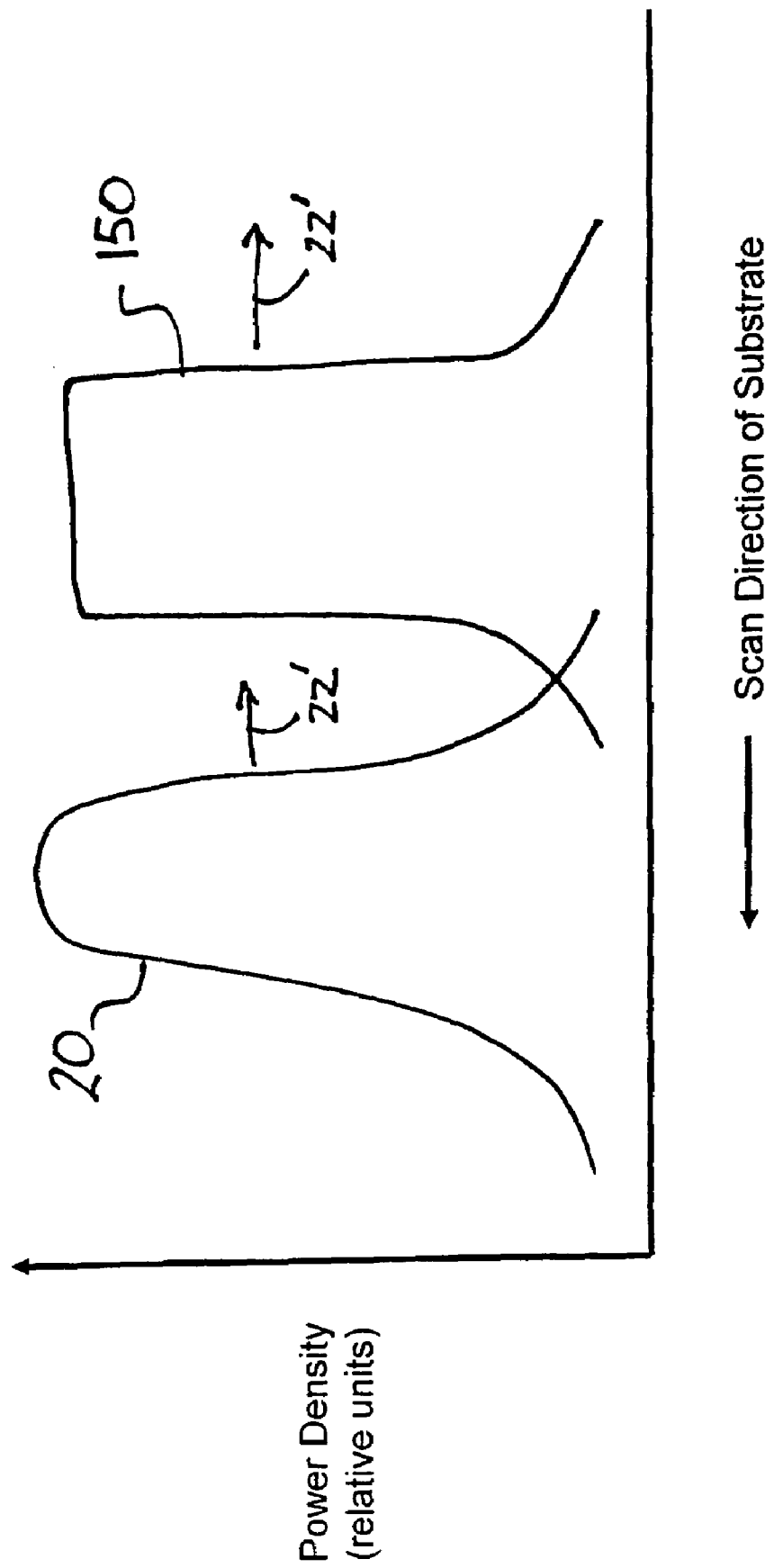
FIG. 4A is a schematic diagram showing an example embodiment of the relative intensities and beam profiles of the pre-heating and annealing radiation beams as a function of position on the substrate surface.

In another example embodiment, preheating radiation beam 150 and annealing radiation beam 20 partially overlap, e.g., at the $1/e^2$ intensity contours of the respective beam intensity profiles, as illustrated in FIG. 4A.

Figure 4B:
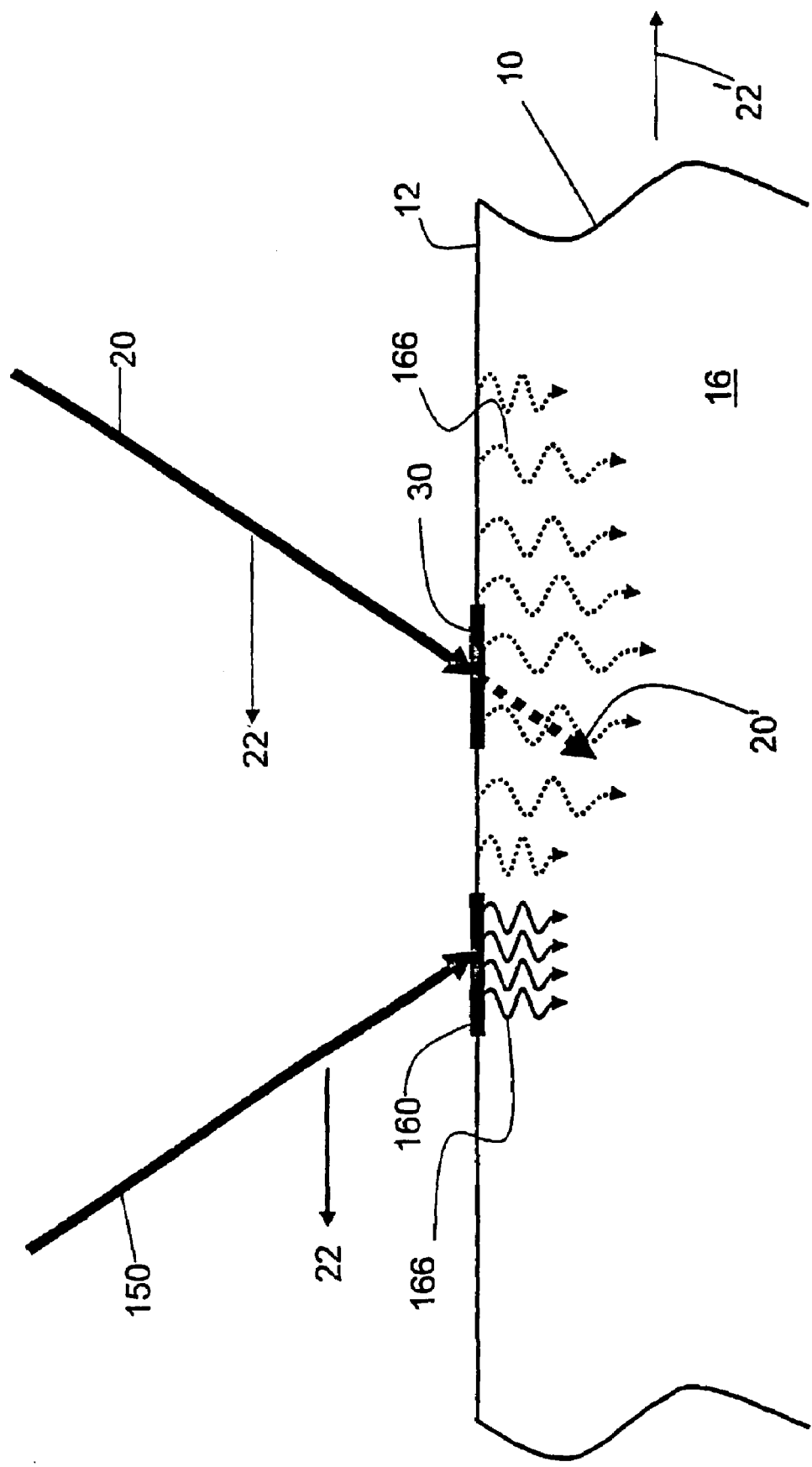
FIG. 4B is a close-up cross-sectional view of the substrate illustrating how heat from the preheating radiation beam imaged in front of the annealing radiation beam promotes absorption of the annealing radiation beam in the substrate to effectuate the self-sustaining annealing condition.

FIG. 4B is a close-up cross-sectional view of an example embodiment of the substrate being irradiated by beams 20 and 150. FIG. 4B illustrates how heat 166 from preheating radiation beam 150 imaged in front of annealing radiation beam 20 promotes absorption of the annealing radiation beam near the top surface of the substrate. Heat 166 from preheating radiation beam 150 diffuses into substrate 10 in front of annealing radiation beam 20. As the radiation beams move relative to the substrate as indicated by arrows 22', annealing radiation beam 20 passes into the region (i.e., substrate portion) previously heated by preheating radiation beam 150. This process is used to raise the temperature of the substrate at and near the substrate surface to above the critical temperature $T_C$. This allows annealing radiation beam 20 to be efficiently absorbed in the substrate, as indicated by absorbed annealing radiation beam 20' (dashed line). The relatively rapid absorption of annealing radiation beam 20' within substrate 10 near substrate surface 12 serves to quickly raise the temperature of the substrate surface to a maximum at the trailing edge of the annealing radiation beam, up to an annealing temperature $T_A$ (e.g., about 1600° K). This leads to annealing of select regions formed in the substrate, e.g., by activating dopants implanted into the top surface of the substrate.

VI. Substrate Temperature Plots

Figure 5:
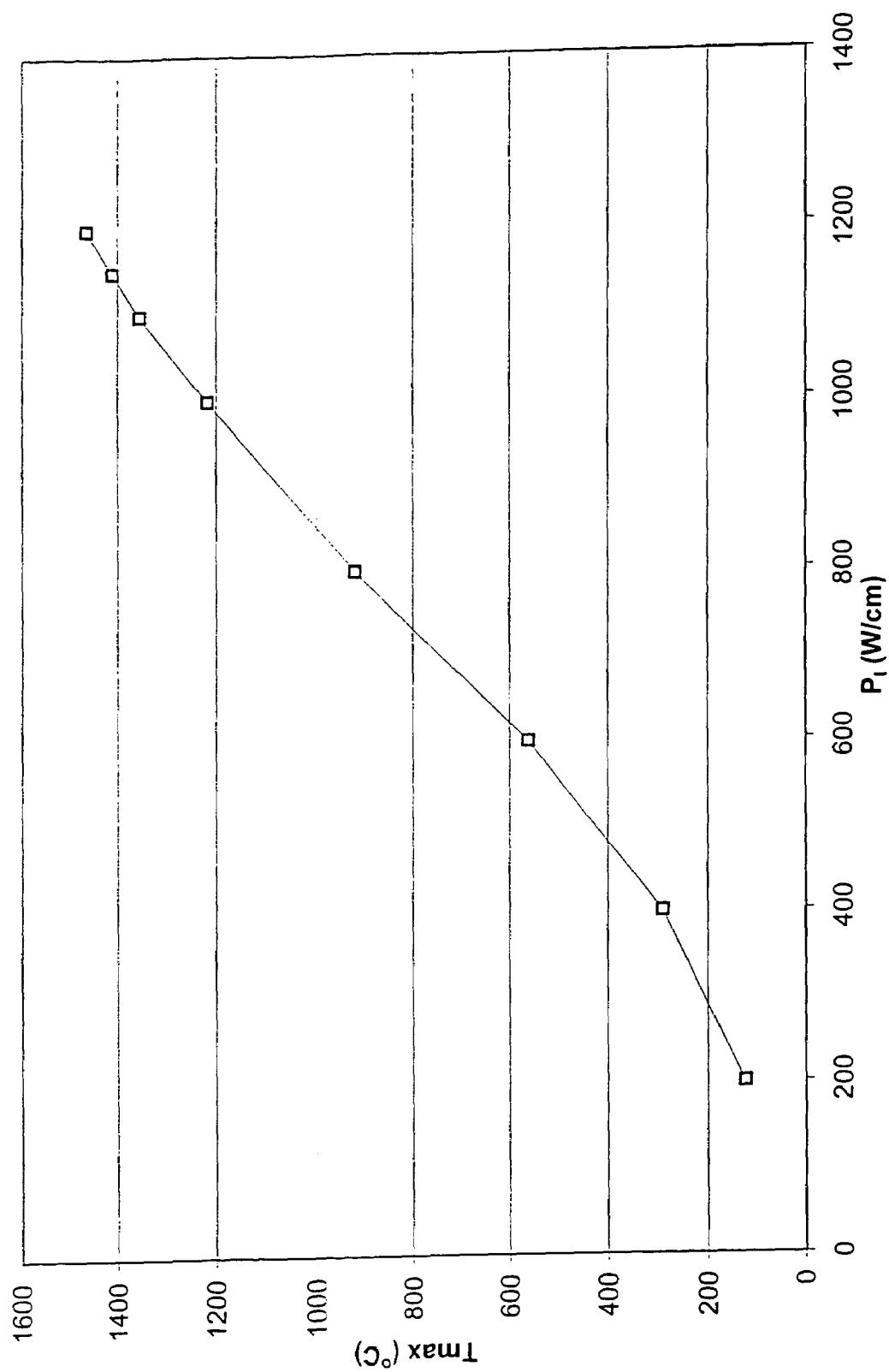
FIG. 5 is a plot of the maximum substrate temperature $T_{MAX}$ (° C.) created by irradiating a heavily doped silicon substrate with the annealing radiation beam having a wavelength of 10.6 µm, versus the incident power $P_I$ (W/cm) of the annealing radiation beam.

FIG. 5 is a plot of the maximum substrate temperature $T_{MAX}$ (° C.) created by irradiating a heavily doped silicon substrate with 10.6 μm radiation, as a function of the incident power $P_I$ (W/cm) of the radiation. A two-dimensional, finite-element simulation program was used to derive this data. The simulation assumed an infinitely long annealing radiation beam. Thus, the beam power is measured in Watts/cm rather than watts/cm². The simulation also assumed annealing radiation beam 20 had a Gaussian beam profile with a Full-Width Half-Maximum (FWHM) of 120 μm, and was scanned across the substrate upper surface 12 at a speed of 600 mm/s, producing a dwell time of 200 μs. Here, "dwell time" is the length of time image 30 formed by annealing radiation beam 20 resides over a particular point on substrate surface 12. In this case, the plot shows an approximately linear relationship between the incident power $P_I$ and the maximum substrate temperature $T_{MAX}$. Because the two-dimensional model assumed that annealing radiation beam 20 is infinitely long, there was no additional energy loss at the ends of line image 30. A finite beam length would result in some additional heat loss at the ends of the beam and therefore result in lower maximum temperatures for a given incident power level $P_I$.

FIG. 5 shows that in an absorbing (i.e., highly doped) substrate, an incident power $P_I$ of about 500 W/cm is required to bring the maximum substrate surface temperature $T_{MAX}$ from ambient up to 427° C. for a specific set of conditions. This can be compared to about 1150 W/cm to take the temperature up to the melting point of silicon at 1410° C. for the same set of conditions.

The relationship shown in FIG. 5 is a good approximation for a preheating radiation beam 150 having the same width and dwell time as annealing radiation beam 20. Thermal diffusion is the dominant mechanism for distributing heat in the substrate in both cases. A peak substrate temperature $T_{MAX}$ of 400° C. does not produce nearly the same absorption of annealing radiation beam 20 as a uniform substrate temperature $T_S$ of 400° C. because the former temperature distribution falls to ambient within the substrate in a distance roughly equal to the thermal diffusion length $L_D$.

Figure 6:
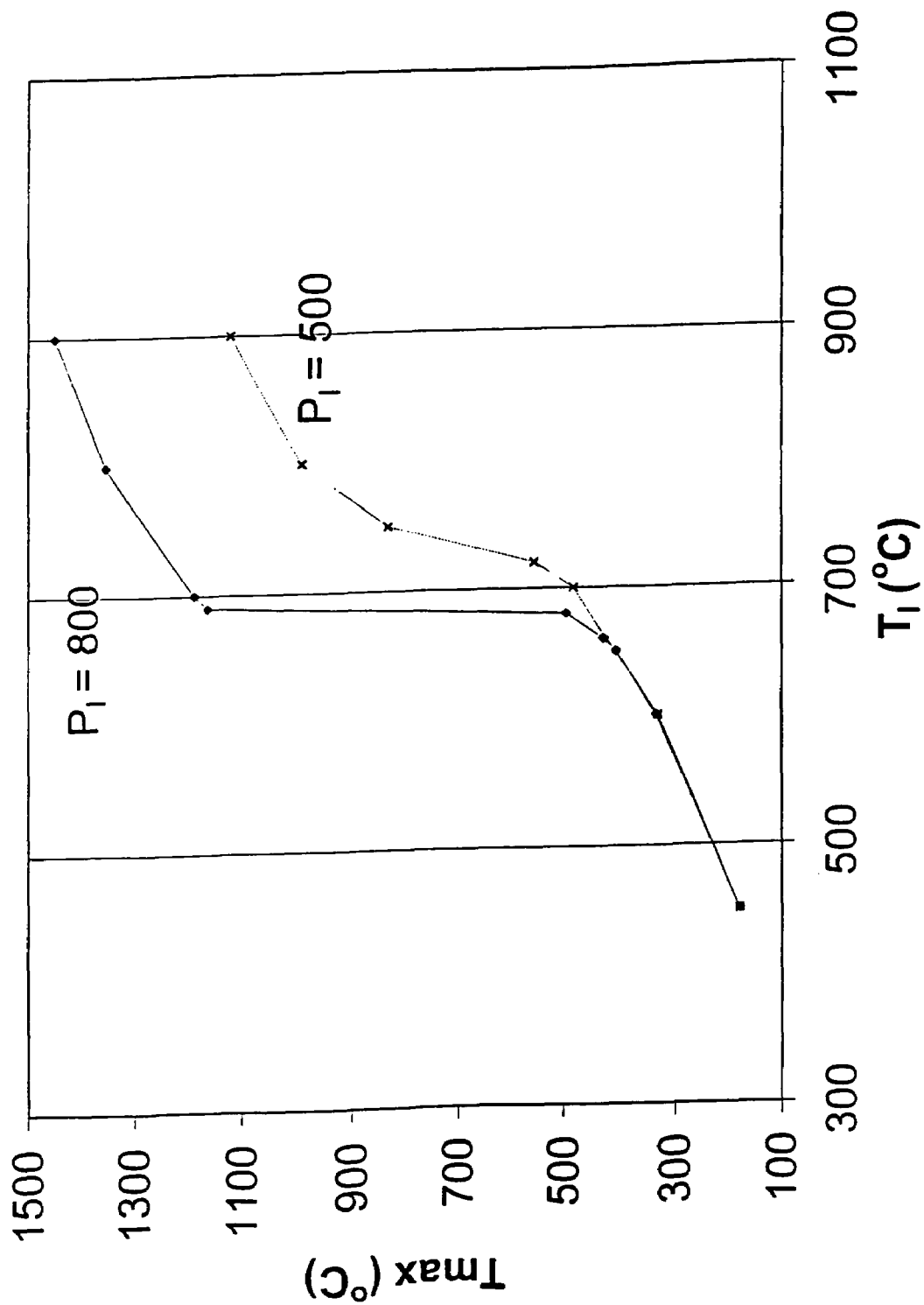
FIG. 6 is a plot, obtained by finite-element simulation, of the maximum substrate temperature $T_{MAX}$ (° C.) as a function of the initial substrate temperature $T_I$ for different incident powers $P_I$ of the annealing radiation beam for an undoped substrate.

FIG. 6 is a plot of the maximum substrate temperature $T_{MAX}$ (° C.) as a function of the initial substrate temperature $T_I$ for two different incident powers $P_I$ of annealing radiation beam 20 of wavelength 10.6 μm for an undoped silicon substrate. This was also derived from a two-dimensional finite element model. For temperatures below about 327° C., the incident radiation produces almost no effect, and the maximum temperature $T_{MAX}$ is almost equal to the initial substrate temperature $T_I$. In other words, annealing radiation beam 20 passes through substrate 10 and does not appreciably heat the substrate. However, at an initial substrate temperature $T_I$ somewhere between 377° C. and 477° C., appreciable absorption of annealing radiation beam 20 occurs, depending on the amount of incident power $P_I$ in the annealing radiation beam. The result is a sharp increase in the maximum substrate temperature $T_{MAX}$. Once the high-absorption, high-temperature transition has occurred, further irradiation by annealing radiation beam 20 increases the maximum temperature $T_{MAX}$ linearly.

Note that the units of power used in the plots of FIGS. 5 and 6 is Watts per centimeter (W/cm). This power refers to the power per unit length of the scanning image 30 (e.g., a line image) contained between the half power points. Thus, a power of 1150 W/cm in image 30 having a width of 120 μm corresponds to an average intensity of 95,833 W/cm².

The temperature that must be generated by preheating radiation source 142 to heat the substrate to the critical temperate $T_C$ in order to create the self-sustaining annealing condition can be estimated from information in the plot of FIG. 6. The plot therein indicates that when a substrate reaches a uniform temperature $T_I$ of about 427° C. there is a sudden increase in the substrate temperature $T_{MAX}$ indicating initiation of the self-sustaining annealing condition. If a laser diode source is used to provide the necessary preheating, then a significantly higher temperature is to be expected since the diode source produces a non-uniform temperature distribution that falls to ambient in about one thermal diffusion length.

Figure 7:
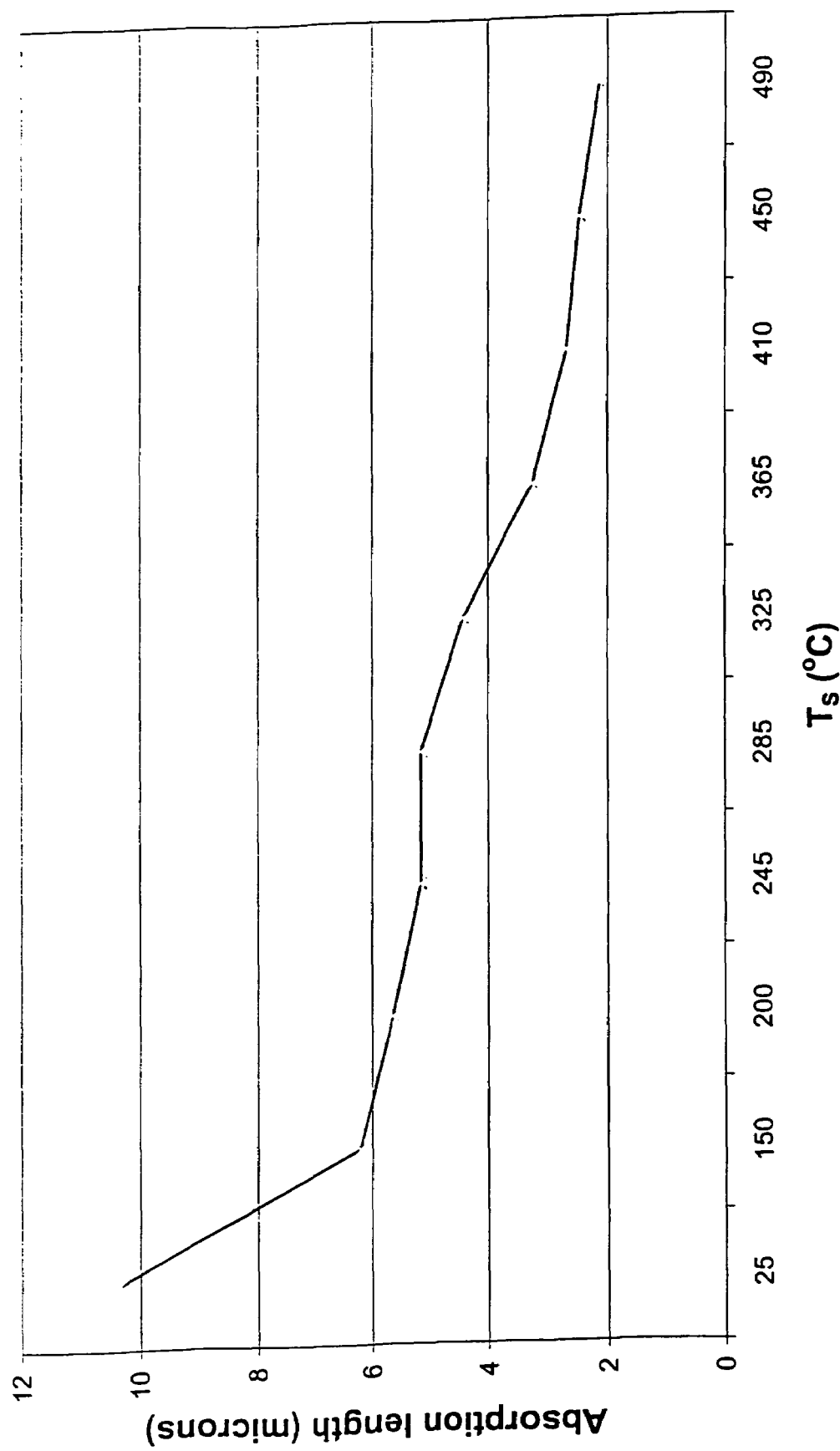
FIG. 7 is a plot of the absorption length $L_A$ (μm) of the 780 nm preheating radiation beam in silicon as a function of substrate temperature $T_S$ (° C.)

FIG. 7 is a plot of the absorption length $L_A$ (μm) of 780 nm radiation in un-doped silicon as a function of substrate temperature $T_S$ (° C.). The absorption characteristics at 800 nm are very similar to that at 780 nm. As can be seen from the plot, even at room temperature the absorption length $L_A$ is about 10 μm, which is short enough to ensure effective heating of the substrate surface region and a temperature distribution determined primarily by thermal diffusion for time scales of 200 μs and above.

In order to obtain efficient absorption of a $CO_2$ laser beam (as annealing radiation beam 20) in an undoped silicon substrate having a non-uniform temperature distribution, such as that created by a laser diode source (as used to generate preheating radiation beam 150), a temperature corresponding to an absorption length of about 100 μm is estimated. This is achieved with a peak substrate temperature $T_{MAX}$ of about 550° C. Referring again to FIG. 5, a maximum substrate temperature $T_{MAX}$ of 550° C. would require preheating radiation beam 150 to have a power of about 600 W/cm (50,000 W/cm²).

VII. Determining the Preheating Radiation Beam Power

In practice it is a simple matter to determine the minimum power in preheating radiation beam 150 needed to achieve efficient coupling of annealing radiation beam 20 to substrate 10. In an example embodiment, with annealing radiation beam 20 set to a power level sufficient to anneal an absorbing substrate, a substrate substantially nonabsorbent at the wavelength of annealing radiation beam 20 at room temperature is irradiated with preheating radiation beam 150 and with annealing radiation beam 20. The power level of the preheating radiation beam 150 is increased until annealing temperatures are detected in the substrate. This may be accomplished, for example, by measuring the substrate temperature with temperature monitor M2 shown in FIG. 1A.

The transition from little or no coupling of the annealing radiation beam with the substrate to efficient coupling at the substrate surface is typically quite sudden. If the substrate temperature $T_S$ is too low there will either not be a transition to annealing temperatures or a sudden transition to the substrate melting point will occur. As the substrate temperature is raised further there will be a narrow range of annealing power levels that permit stable operation below the melting temperature. A further increase in substrate temperature increases the range of annealing power levels and the corresponding range of annealing temperatures. Thus, there is no sharply defined power level of preheating radiation beam 150 to initiate the absorption transition of annealing radiation beam 20 in the substrate, or alternatively, that leads to the annealing temperatures in the substrate. However there is a minimum practical power level below which the desired range of annealing temperatures cannot be reliably achieved. In an example embodiment, preheating radiation beam 150 is set to a power level slightly above this minimum power level needed to ensure that the annealing radiation beam is efficiently absorbed by the substrate and that a large range of annealing temperatures are readily accessed.

In an example embodiment, the amount of power $P_I$ in preheating radiation beam 150 required to initiate the self-sustaining annealing condition is that necessary to produce a maximum substrate temperature $T_{MAX}$ of 550° C. Assuming a 200 µs dwell time, the graph on FIG. 5 indicates that this corresponds to an incident power of about 600 W/cm. However, obtaining an intensity of say 600 W/cm in a preheating radiation beam 150 that produces an image 160 having a width comparable to that of annealing radiation beam image 30 is not as easy as it might first appear. In an example embodiment, it is desirable that preheating radiation beam 150 have an angle of incidence $\theta_{150}$ at or near the Brewster's angle for silicon, which is about 75°. This angle minimizes the reflected radiation and equalizes the energy absorbed in the substrate for the types of structures likely to be present on the substrate. At an incident angle $\theta_{150}$ of about 75°, preheating radiation beam 150 is smeared out at substrate surface 12 and covers an area increased by a factor of about 4, and the intensity is reduced proportionally.

The total power in preheating radiation beam 150 can be increased, for example, by making the preheating source larger, e.g., by adding additional rows of laser diodes. However, this increases the width of preheating radiation beam 150 proportionally. An increased preheating radiation beam width increases the dwell time and the thermal diffusion depth, which further increases the power required to attain a given maximum temperature. Thus, relay lens 143 needs to be designed so that it can provide a preheating radiation beam 150 having sufficient intensity to heat the substrate to within the critical temperate range using available preheating radiation sources 142. An example of such a relay according to the present invention is described immediately below.

VIII. Example Embodiment of Optical Relay System

Figure 8A:
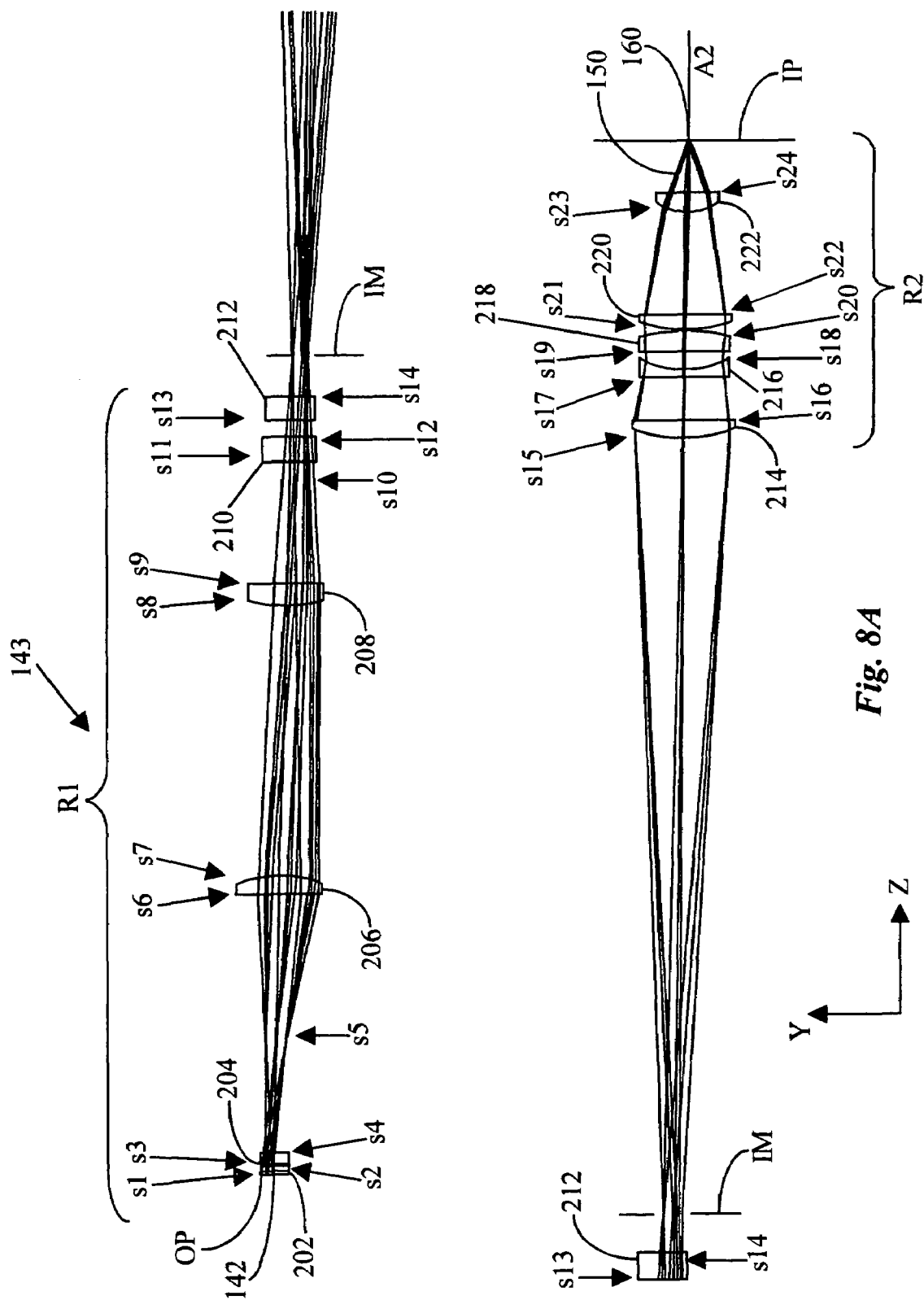
FIG. 8A is a cross-sectional view of an embodiment of the optical relay system of FIG. 1C, as viewed in the Y-Z plane.
Figure 8B:
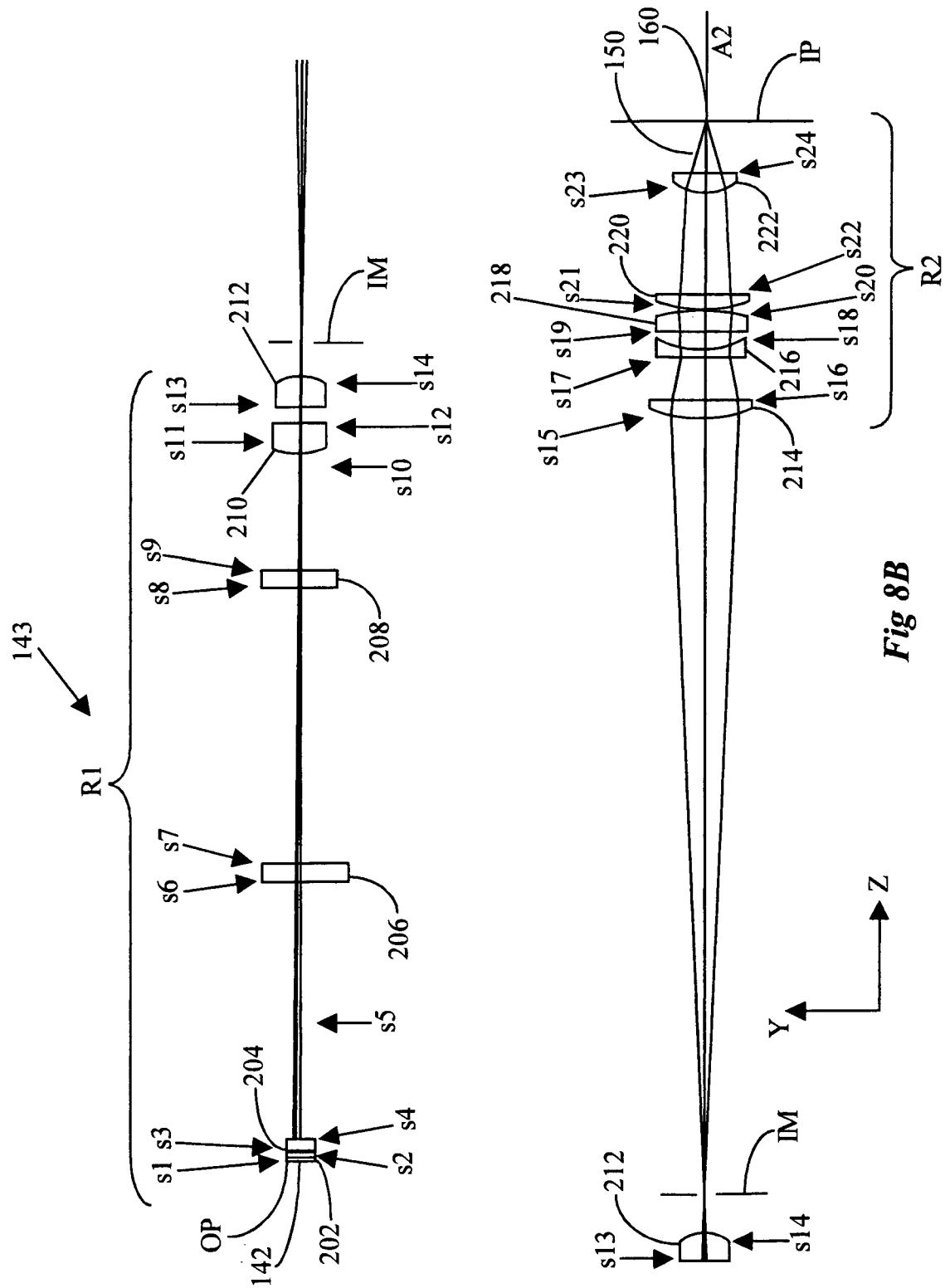
FIG. 8B is a cross-sectional view of the embodiment of the optical relay system of FIG. 1C and FIG. 8A, as viewed in the X-Z plane.

FIGS. 8A and 8B are respective cross-sectional views of an example embodiment of optical relay system 140 and substrate 10. FIG. 8A is a view in the Y-Z plane, and FIG. 8B is a view in the X-Z plane. In both FIGS. 8A and 8B, the relay has been divided into two parts in order to fit on the page and the lens element with surfaces S13 and S14 is shown in both parts.

In the example embodiment, preheating radiation source 142 includes a 2-dimensional laser diode array, such as the LightStack™ 7×1/L PV array available from Coherent Semiconductor Group. 5100 Patrick Henry Drive, Santa Clara, Calif. 95054. The LightStack™ array contains 7 rows of water-cooled laser diodes each 10 mm long and stacked on 1.9 mm spacing. Each row of diodes is capable of emitting 80 watts of optical power. Relay lens 143 includes an object plane OP (where preheating radiation source 142 is arranged), an image plane IP (where substrate 10 is arranged), and optical axis A2 connecting the image and object planes.

In an example embodiment and as discussed above, relay lens 143 is designed to create a preheating radiation beam 150 that forms an image 160 (e.g., a line image) that is scanned over substrate 10. The scanning of image 160 can be accomplished in any number of ways, such as by moving chuck 28 (via movable stage MS) relative to relay lens 143 (FIG. 1C). Locally irradiating substrate 10 with image 160 is preferred to irradiating the entire substrate at once because it is much easier to achieve the high beam intensity needed to heat the substrate over a relatively small image area. Thus, the local preheating provided by relay lens 143 must be synchronized with irradiating the substrate with annealing radiation beam 20.

Since the emission characteristics of laser diodes are anisotropic and the spacing between adjacent diodes is greatly different in the X and Y planes, relay lens 143 needs to be anamorphic in order to efficiently form image 160 at substrate 10. Furthermore, to achieve the required intensity in image 160 at substrate 10, a relatively high numerical aperture at image plane IP is necessary.

Thus, with reference also to FIGS. 9A and 9B, relay lens 143 includes in order from preheating radiation source 142 and along optical axis A2, a cylindrical lens array 200 having lenslets 201 corresponding to the number of rows of laser diodes 198 making up preheating radiation source 142. Cylindrical lens array 200 has power in the X-Z plane and acts to collimate each preheating radiation beam 147 emitted from radiation source 142 in the X-Z (FIG. 9A) plane, while allowing the radiation to have a 10° cone angle in the Y-Z plane (FIG. 9B). The combination of the diode array and the cylindrical lens array serves as the input to an anamorphic relay, which reimages the cylindrical lens array onto the substrate.

Table 1 sets forth the lens design data for an example embodiment of relay lens 143 as illustrated in FIGS. 8A and 8B.

With reference again to FIGS. 8A and 8B, relay lens 143 consists of two imaging sub-relays R-1 and R-2 in series with a common intermediate image plane IM. Subrelay R1 is an anamorphic relay employing mainly cylindrical lens elements with substantially different powers in the Y-Z and X-Z planes, while subrelay R-2 is a conventional relay employing spherical elements and having a demagnification ratio of 1:6. The anamorphic relay R-1 has a 1:1 magnification ratio in the Y-Z plane, and a 1:10 demagnification ratio in the X-Z plane. The relay lens 143 is telecentric at the object plane OP and image focal plane IP.

Telecentricity at both the object plane OP and the image plane IP is achieved with a spherical field lens 202 (surfaces s1–s2) and a cylindrical lens 204 (surfaces s3–s4) arranged immediately adjacent preheating radiation source 142. The cylindrical lens 204 has power only in the Y-Z plane and forms a pupil image in the Y-Z plane at s5. Next are two cylindrical lenses, 206 and 208 (surfaces s6–s9) with power in the Y-Z plane that reimage the diode array at 1:1 at the intermediate image plane. Surface s10 identifies a pupil plane in the X-Z plane. These are followed by a pair of cylindrical lenses, 210 and 212 (surfaces s11–s14) having power in the X-Z plane that also reimage the diode array at the intermediate image plane at a demagnification ratio of 10:1. The intermediate image is reimaged on the final image plane by a group of spherical lenses, 214–222 (surfaces s15–s24) that form a sub-relay with a demagnification ratio of 6:1. Thus the relay has an overall demagnification of 6:1 in the plane containing the rows of diodes, and 60:1 in the plane normal to each row of diodes.

The 6:1 demagnification ratio in the Y-Z plane reduces the 10 mm size of the uncollimated (slow-axis) of preheating radiation source 142 from 10 mm at object plane OP to 1.67 mm at image plane IP. Also, in the same plane the 10° cone angle of radiation emitted from the preheating radiation source 142 at object plane OP is increased to 60° at image plane IP.

The demagnification in the X-Z plane is 60:1. Thus, the 11.4 mm dimension (as measured in the X-direction across 7 rows of diodes) of the laser diode array making up effective source 220 at object plane OP is reduced to 0.19 mm at image plane IP. In addition, the 1° FWHM angular spread in the collimated beam at effective source 220 is increased to a 60° cone angle at image plane IP.

If it is assumed that the overall efficiency of transmitting preheating radiation 147 from radiation source 142 at object plane OP to substrate 10 at image plane IP is 50% (including reflection losses at substrate surface 12), then relay lens 143 of FIGS. 8A and 8B is capable of bringing 280 W into image 160. For the example image 160 dimensions of 1.6 mm by 0.19 mm, this achieves a power density of 921 W/mm². At normal incidence ($\theta_{150}=0°$), this power density will raise the temperature of a room-temperature (i.e., ~20° C.) silicon substrate 10 by about 500° C. to a temperature near 520° C. assuming a dwell time of about 0.2 ms. This is above the critical, uniform temperature $T_C$ of 400° C. required to initiate the self-sustaining annealing condition and is in the right range for a non-uniform temperature distribution such as that produced by a diode array image 160 located just in front of the annealing laser image 30. In this case, it is assumed that preheating radiation beam 150 precedes (i.e., is scanned in front of) annealing radiation beam 20. In this way, the maximum temperature $T_{MAX}$ created by the preheating radiation beam is achieved just prior to annealing radiation beam 20 irradiating the same preheated portion of the substrate. In an example embodiment, the relative position of the preheating and annealing radiation beams are reversed each time the scan direction is reversed so that the preheating radiation beam always precedes the annealing radiation beam.

IX. Radiation Beam Scanning and Orientation

As mentioned above, in an example embodiment, image 160 formed by preheating radiation beam 150 is scanned over substrate 10. In conjunction therewith, image 30 formed by annealing radiation beam 20 is also scanned over the substrate so that it is incident on the substrate portion(s) preheated by the preheated radiation beam.

In example embodiments, scanning is carried out by moving the substrate in a spiral, raster or boustrophedonic pattern. In a boustrophedonic scanning pattern, the scan direction is reversed and the cross-scan position incremented after every scan. In this case, as mentioned above, it is necessary to change the relative positions of preheating radiation beam 150 and annealing radiation beam 20 between each scan. In an example embodiment, this is accomplished by shifting the position of the entire relay lens 143. Where annealing radiation beam 20 is about 120 μm wide (FWHM) and preheating radiation beam 250 is about 190 μm wide (top-hat profile), then relay lens 143 needs to be moved by about twice the distance between the beam centers or about 393 μm in a direction parallel to the scan direction. This is accomplished, for example, via a signal from controller 32, which is operatively connected to preheating relay lens 143 to effectuate movement of the relay lens (FIG. 1C). In a like manner, controller 32 controls the focus of preheating radiation beam 150 by adjusting the focus, tip, and tilt parameters of the substrate prior to scanning.

As discussed in aforementioned U.S. patent application Ser. No. 10/287,864, it is desirable to have annealing radiation beam 20 be incident substrate 10 at an incident angle at or near the Brewster's angle, and be P-polarized. This is because the film stacks likely to be encountered on a substrate during annealing have a low reflectivity and a small variation in reflectivity under these conditions.

In an example embodiment, preheating radiation beam 150 is arranged so that it strikes the substrate at incident angle $\theta_{150}$, at or near the Brewster's angle in a manner similar to that of annealing radiation beam 20. Generally this angle reduces the variation in reflectivity between the different film stacks likely to be found on a substrate prior to the activation (annealing) step. However, while this beam orientation (angle) works very well at the annealing wavelength, it is not as effective at the wavelength used for preheating. The rough equivalence between the preheating radiation beam wavelengths and the thickness of the films used to make semiconductor structures (e.g., devices 14, such as transistors) leads to a greater variation in substrate reflectivity at all angles of incidence. Furthermore, an incident angle $\theta_{150}$ at or near Brewster's angle spreads image 160 over an area 3 or 4 times bigger than at normal incidence (i.e., $\theta_{150}=0°$) and lowers the power density a corresponding amount. If the scan rate is left unchanged, since it is usually set by the annealing radiation beam geometry, then the maximum temperature is also reduced.

Figure 10A:
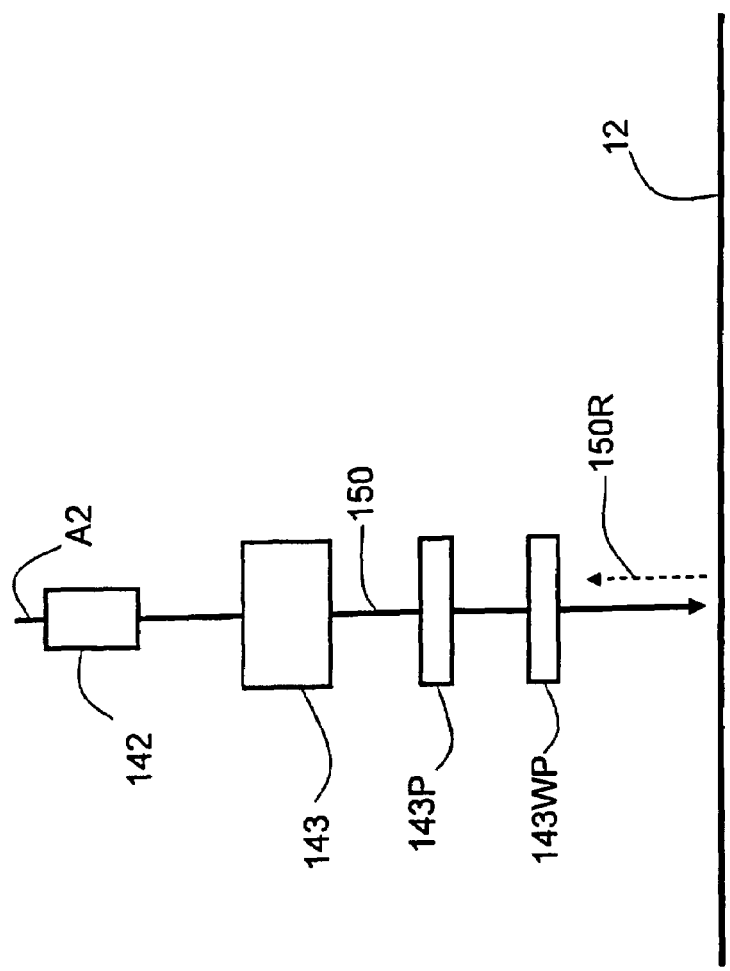
FIG. 10A is a close-up schematic diagram of the preheating radiation source, relay lens and preheating radiation beam at normal incidence to the substrate and further including a polarizer and quarter waveplate arranged in the preheating radiation beam to reduce the amount of preheating radiation reflected from the substrate and returning to the preheating radiation source.
Figure 10B:
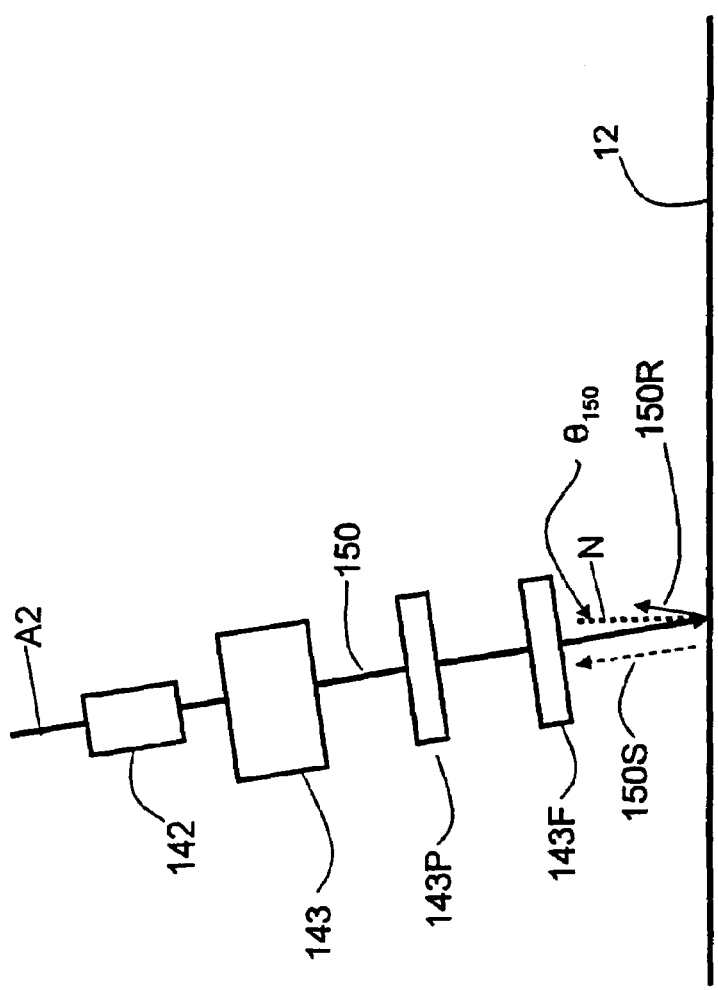
FIG. 10B is a close-up schematic diagram of the preheating radiation source, relay lens and preheating radiation beam at near-normal incidence to the substrate and further including a polarizer and Faraday rotator arranged in the preheating radiation beam to reduce the amount of preheating radiation scattered from the substrate and returning to the preheating radiation source.

One of the problems with operating at normal incidence or near normal incidence is that the reflected proportion of the radiation can be quite high and can cause serious damage if it returns to the radiation source (e.g., diode array). FIGS. 10A and 10B are schematic diagrams illustrating example embodiments of preheating relay optical system 140 for decreasing the amounts of preheating radiation reflected or scattered back to the preheating radiation source 142 (FIG. 1C). With reference to FIG. 10A, in a preferred embodiment, preheating radiation beam 150 has a normal incident angle of $\theta_{150}=0°$. A normal angle of incidence results in an amount of preheating radiation beam 150 being reflected from the substrate (the reflected preheating radiation is denoted 150R) and being transmitted back toward the preheating radiation source 142. If reflected preheating radiation 150R makes it back to preheating radiation source 142, it may accelerate the source's time to failure. Where emitted preheating radiation 147 is polarized (such as is the case with laser diodes), then in an example embodiment, the amount of reflected preheating radiation 150R returning to the preheating radiation source is reduced by arranging a polarizer 143P aligned with the polarization direction of the preheating radiation beam, and a quarter-wave plate 143WP located between the polarizer and the substrate. The quarter wave plate converts the radiation traveling from the polarizer to the substrate into circularly polarized radiation at the substrate. Any radiation returning from the substrate is converted back to linearly polarized radiation after passing through the quarter wave plate. However, the direction of polarization of the returning radiation is orthogonal to the original direction. Thus the returning beam is not transmitted by the polarizer and does not reach the laser diode array.

With reference now to FIG. 10B, even if the incidence angle $\theta_{150}$ is chosen off-normal incidence so that reflected (specular) preheating radiation 150 cannot return to the preheating radiation source, scattered (or non-specular) preheating radiation 150S returning to preheating radiation source can present a problem. Even a small amount of radiation returned to some types of preheating radiation sources (such as lasers) can cause operational instability. Also, it is desirable to employ p-polarized preheating radiation when operating off of normal incidence in order to increase the proportion of radiation that is absorbed in the substrate and to reduce the variation in absorption caused by the various structures on the substrate.

Thus, in an example embodiment, the amount of preheating radiation 150S that returns to the preheating radiation source 142 is reduced by adding a polarizer 143P and a Faraday rotator 143F downstream of relay lens 143. The Faraday rotator 143F is located between the polarizer 143P and substrate 10. In operation, the Faraday rotator rotates the polarization of the preheating radiation beam 150 by 90° after two passes through the rotator, and the polarizer blocks the polarization-rotated preheating radiation 150S from returning to preheating radiation source 142. Operating optical relay system 140 such that preheating radiation beam 150 is off of normal incidence also facilitates measuring the power in reflected preheating radiation beam 150R, which is a useful diagnostic.

Measurements of the power in incident preheating radiation beam 150 and reflected preheating radiation 150R can be used to calculate the power absorbed by the substrate 10. This is then used to estimate the maximum temperature produced by preheating radiation beam 150. By keeping the absorbed power in preheating radiation beam 150 above a certain minimum threshold, preheating sufficient to trigger strong absorption of the annealing radiation beam 20 by the substrate is assured.

While it is preferable to irradiate substrate 10 with preheating radiation 150 at an angle $\theta_{150}$ that minimizes reflection of the preheating radiation beam, this is not always convenient or possible. This is because the reflectivity of substrate 10 depends on the nature of surface 12, which can have a variety of thin films and other structures residing thereon.

These structures range from bare silicon in the junction areas, to field oxide, to polysilicon on field oxide. It has been estimated a typical integrated circuit comprises 30% to 50% field oxide, about 15% to 20% bare silicon or polysilicon on silicon, and the rest is polysilicon on field oxide. However these proportions vary from circuit to circuit and even across a circuit.

Figure 11:
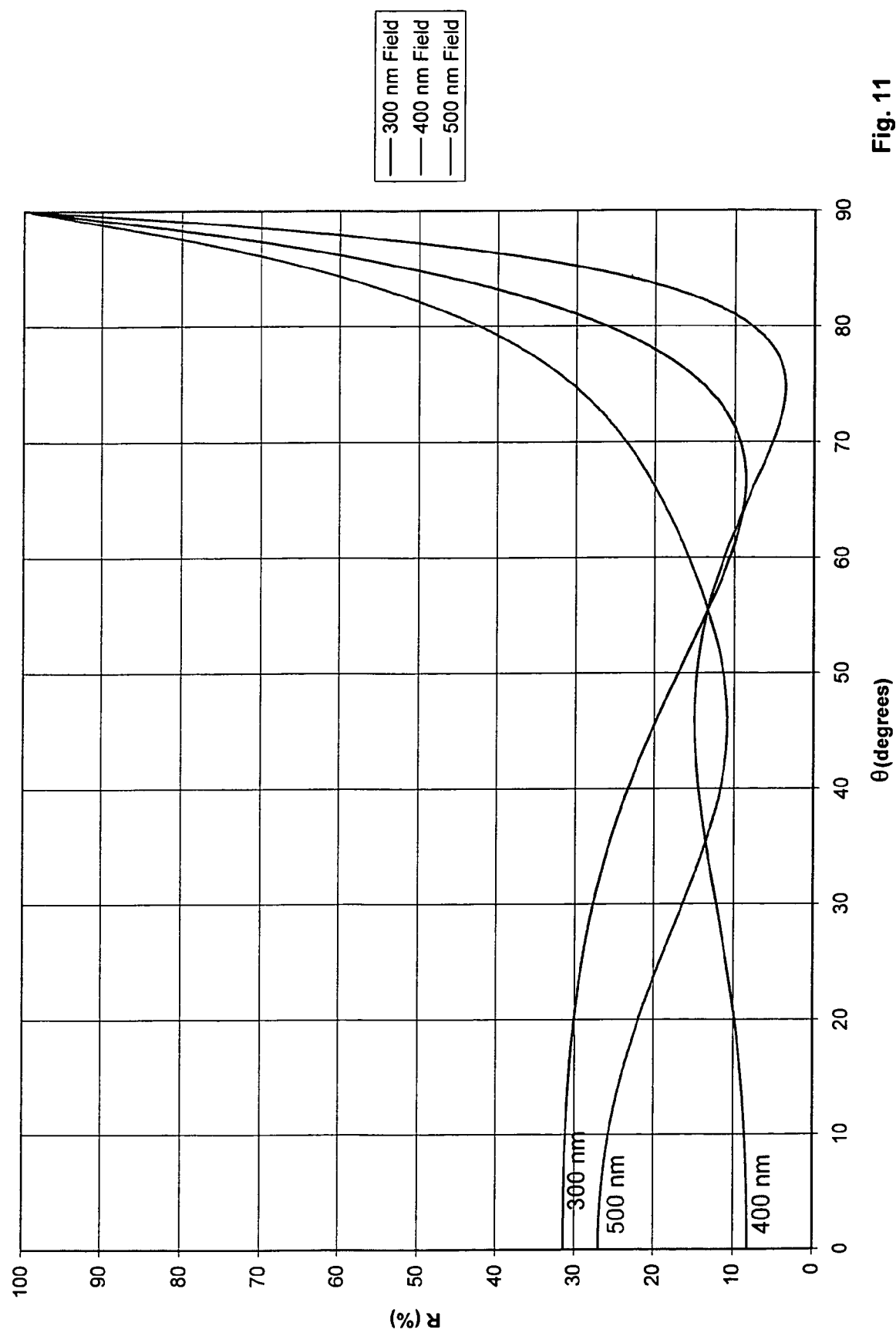
FIG. 11 is a plot that shows the variation of reflectivity R (%) with incidence angle θ (degrees) of bare silicon along with field oxide films of 300 nm, 400 nm and 500 nm in thickness on a silicon substrate.

FIG. 11 is a plot that shows the variation of reflectivity R (%) with incidence angle $\theta_{150}$ (degrees) of bare silicon along with example field oxide films (300 nm, 400 nm and 500 nm) that are typically present on a silicon substrate ready for junction activation. The plot of FIG. 11 assumes the radiation incident on the substrate has a wavelength of 800 nm and is P-polarized. As can be seen from the plot, for these films the optimum operating point corresponds to an incident angle θ of about 55°, which is the angle where the reflectivities are all equal to about 14%.

Figure 12:
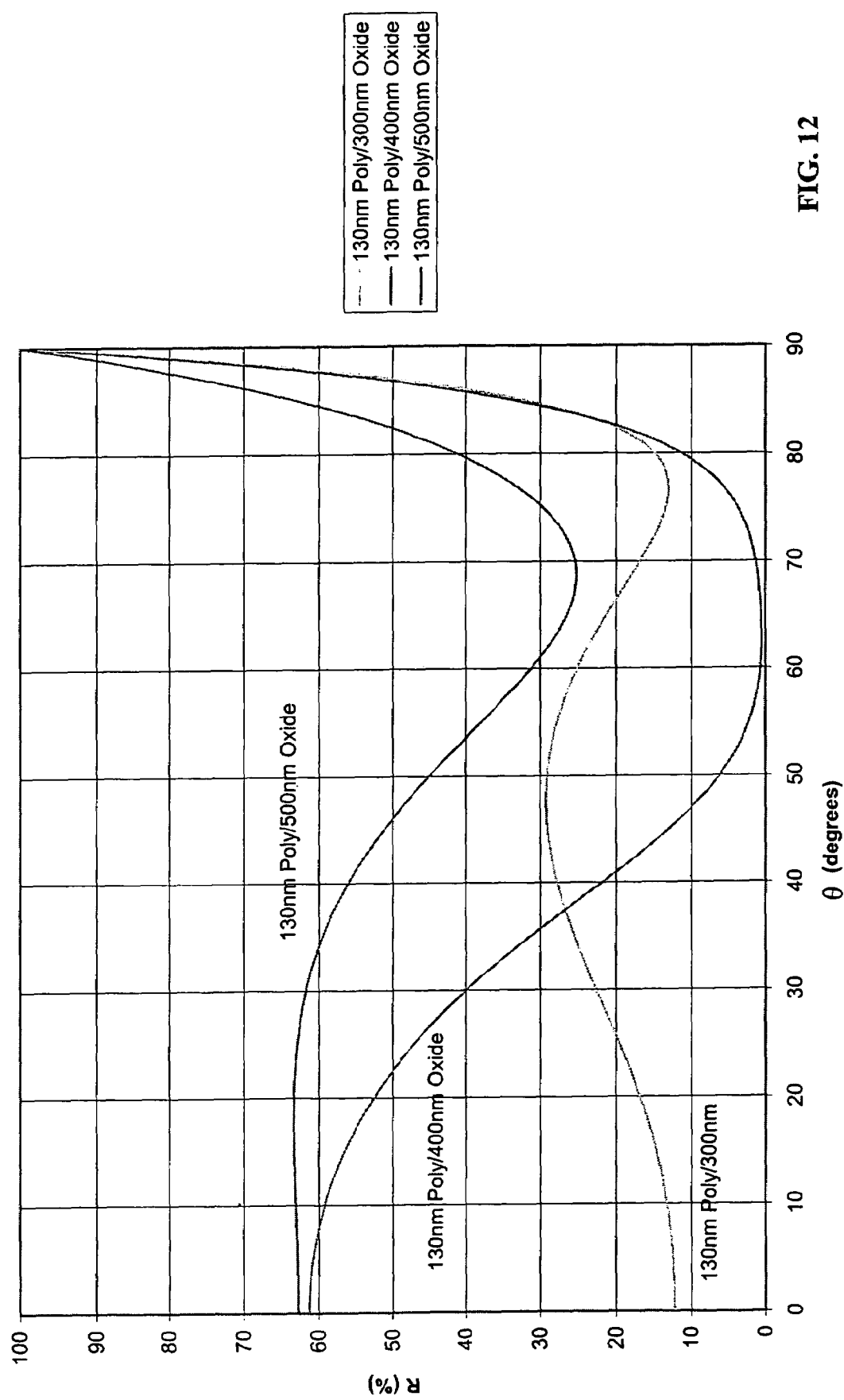
FIG. 12 is a plot similar to FIG. 11 that shows the reflectivities of a 130 nm thick layer of polysilicon with oxide layers having respective thicknesses of 300 nm, 400 nm and 500 nm on a silicon substrate.

FIG. 12 is a plot similar to FIG. 11 and shows the reflectivities of a 130 nm thick layer of polysilicon on oxide layers having thicknesses of 300 nm, 400 nm and 500 nm, on a silicon substrate. In this case there is no ideal operating incident angle, however 55° is a reasonable choice. In practice, the presence of an activated dopant in the polysilicon and silicon layers renders these regions more metal-like and raises the reflectivity at all angles of incidence.

Figure 16:
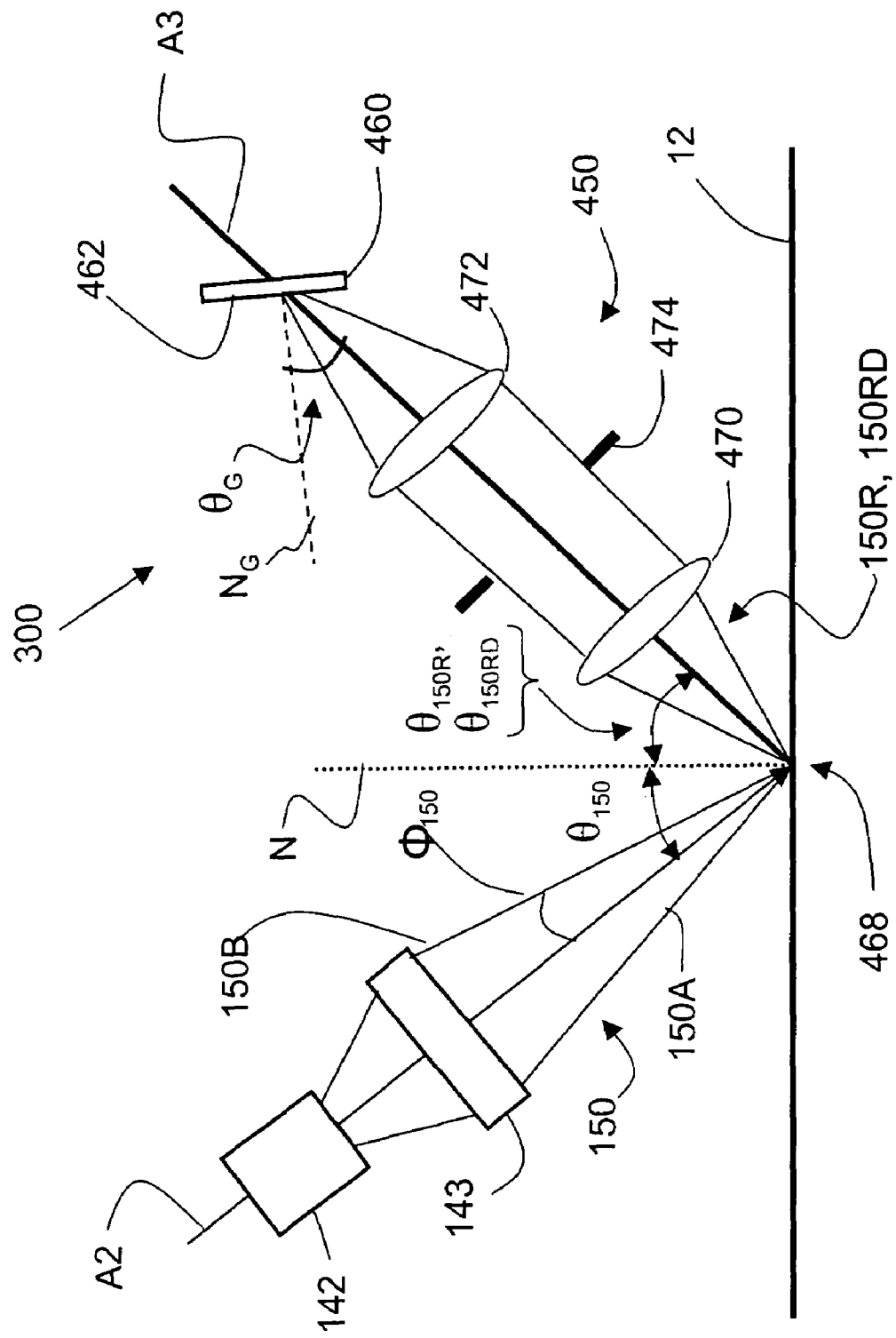
FIG. 16 is a cross-sectional diagram of another example embodiment of the recycling optical system of FIG. 13 that includes a collecting/focusing lens and a grating.

With reference briefly to FIG. 16, discussed in greater detail below, to transfer enough energy from preheating radiation source 142 to substrate 10, it is necessary that the preheating radiation beam 150 employ a substantial range of incident angles at the substrate, i.e., preheating lens 143 has a substantial numerical aperture NA=sin $\phi_{150}$, wherein $\phi_{150}$ is the half-angle formed by axis A2 and the outer rays 150A or 150B of preheating radiation beam 150. Note that incident angle $\theta_{150}$ is measured between the surface normal N and axis A2, wherein the latter also represents an axial ray of preheating radiation beam 150. The angle between the axial ray and the surface normal N is referred to herein as the "central angle" of the range of angles.

In an example embodiment, if a 20° range of incident angles is considered in the plane of incidence, then the plot of FIG. 11 suggests a good choice to minimize the variation of reflectivity between the various film stacks is a spread in incident angles $\theta_{150}$ from about 42° to about 62°, with the center at about 52°.

Because in practice it is difficult to eliminate preheating radiation from reflecting from the substrate, an example embodiment of the present invention involves capturing reflected preheating radiation 150R and redirecting it back toward the substrate as "recycled radiation 150RD," where it can be absorbed and contribute to substrate heating.

Figure 13:
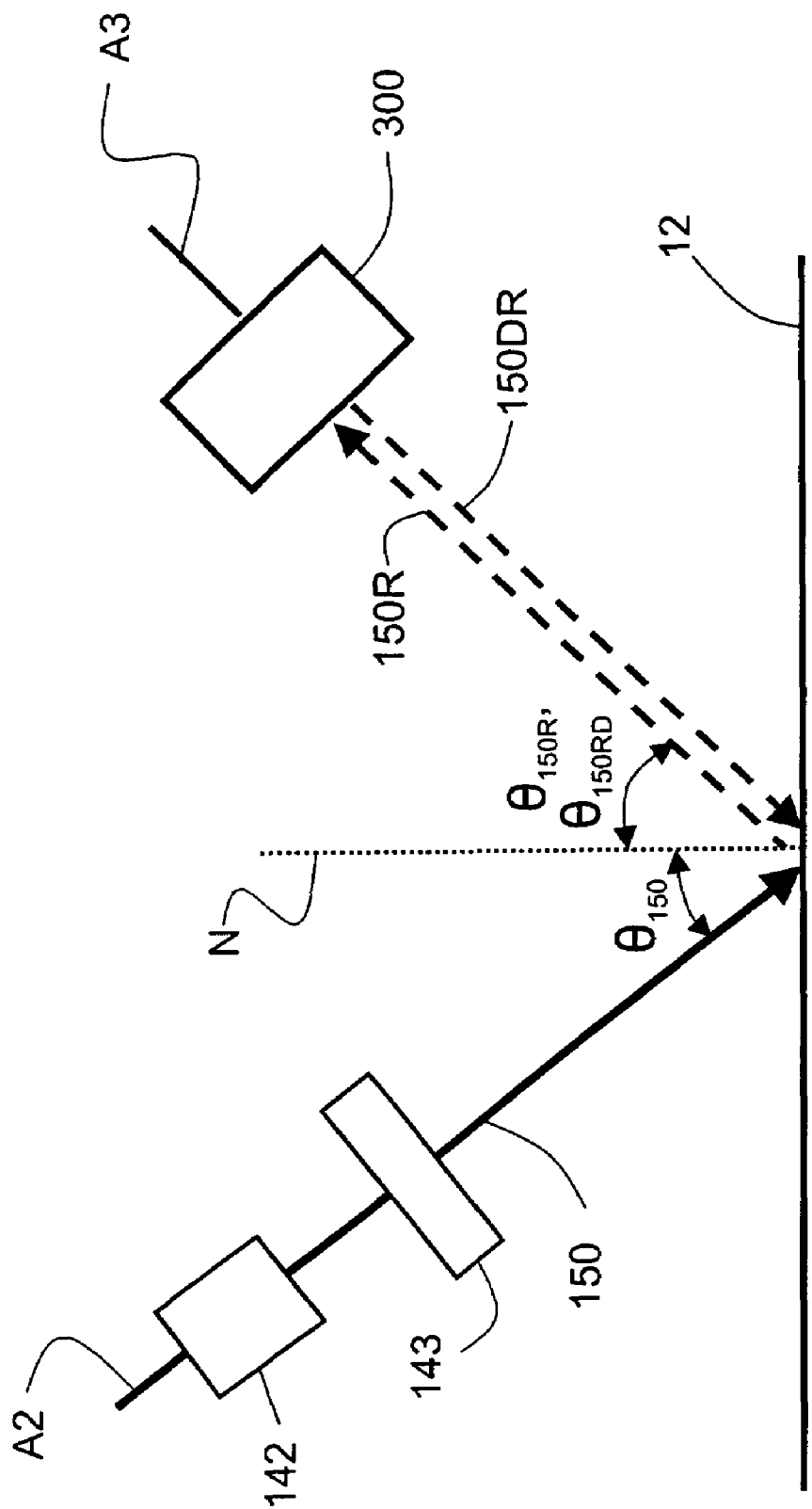
FIG. 13 is a close-up schematic diagram of an example embodiment of the LTA apparatus of the present invention similar to FIG. 10B, but that includes a recycling optical system 300 arranged to receive reflected preheating radiation 150R and direct it back toward the substrate.

Thus, with reference now to FIG. 13, there is shown a close-up schematic diagram of an example embodiment of the LTA apparatus 8 of the present invention, similar to that of FIG. 10B, that includes a recycling optical system 300 arranged to receive reflected preheating radiation 150R and redirect it back to the substrate as recycled preheating radiation 150RD. Recycling optical system 300 is arranged along an axis A3 that makes an angle $\theta_{150RD}$ relative to surface normal N. In order for recycling system 300 to best receive reflected preheating radiation 150R, in an example embodiment angle $\theta_{150RD}$ is made equal to preheating radiation beam incident angle $\theta_{150}$.

Figure 14:
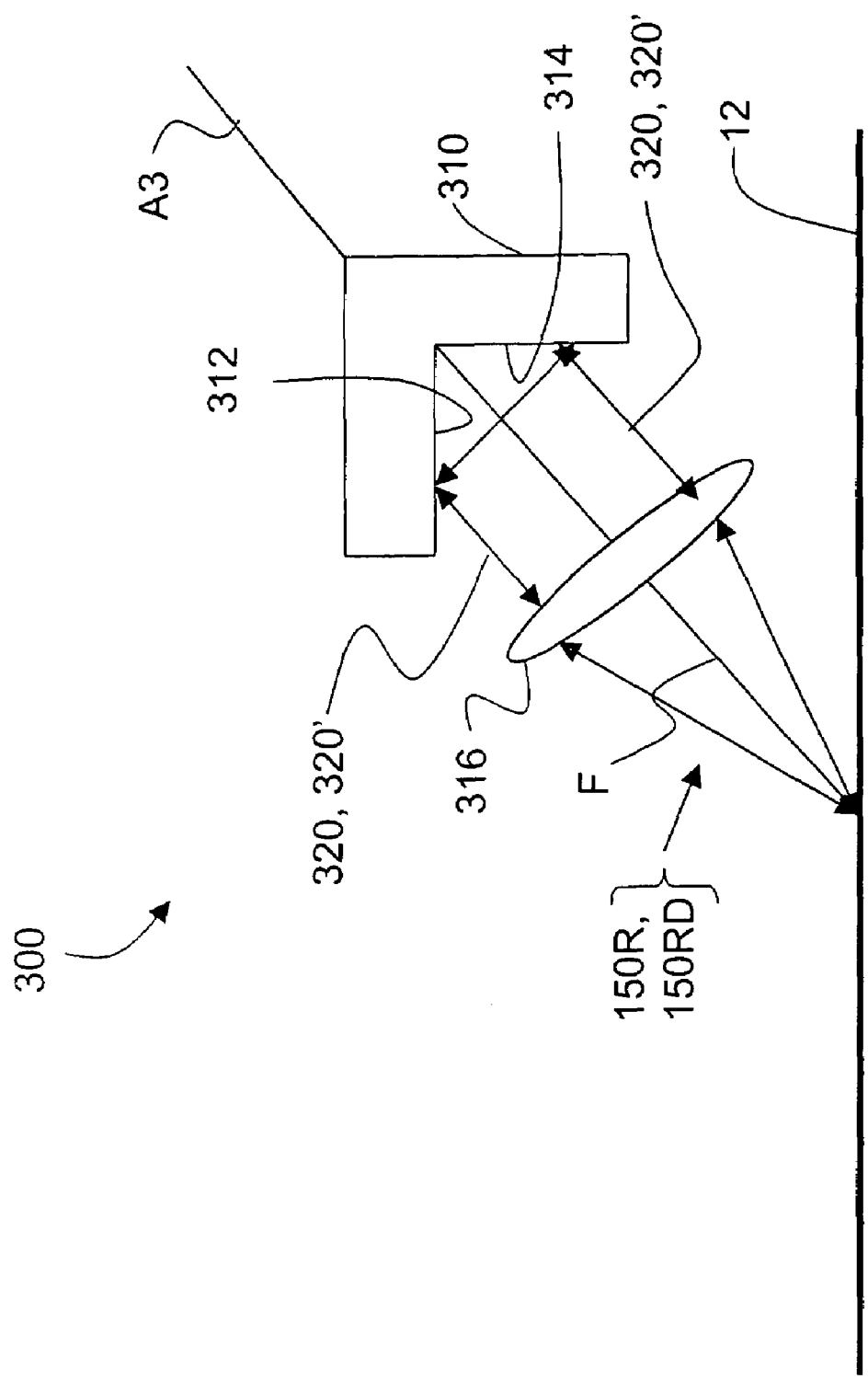
FIG. 14 is a cross-sectional diagram of an example embodiment of the recycling optical system of FIG. 13 that includes a corner reflector and a collecting/focusing lens.

FIG. 14 is a cross-sectional diagram of an example embodiment of recycling optical system 300 that includes a hollow corner cube reflector 310 and a collecting/focusing lens 316 having a focal length F that corresponds to the distance from the lens to substrate surface 12. Hollow corner cube reflector 310 has 3 reflecting surfaces that intersect at right angles, although to simplify the drawing only 2 surfaces, 312 and 314, are shown schematically in the FIG. 14.

In operation, lens 316 collects reflected preheating radiation 150R from substrate surface 12 and directs it to corner cube reflector surfaces 312 and 314 as parallel rays 320. The parallel rays reflect from the 3 reflector surfaces and are directed back in exactly the opposite direction to lens 316 as parallel rays 320' that now constitute recycled preheating radiation 150RD. Parallel rays 320' are collected by lens 316 and refocused at substrate surface 12 back at their point of origin.

Figure 15:
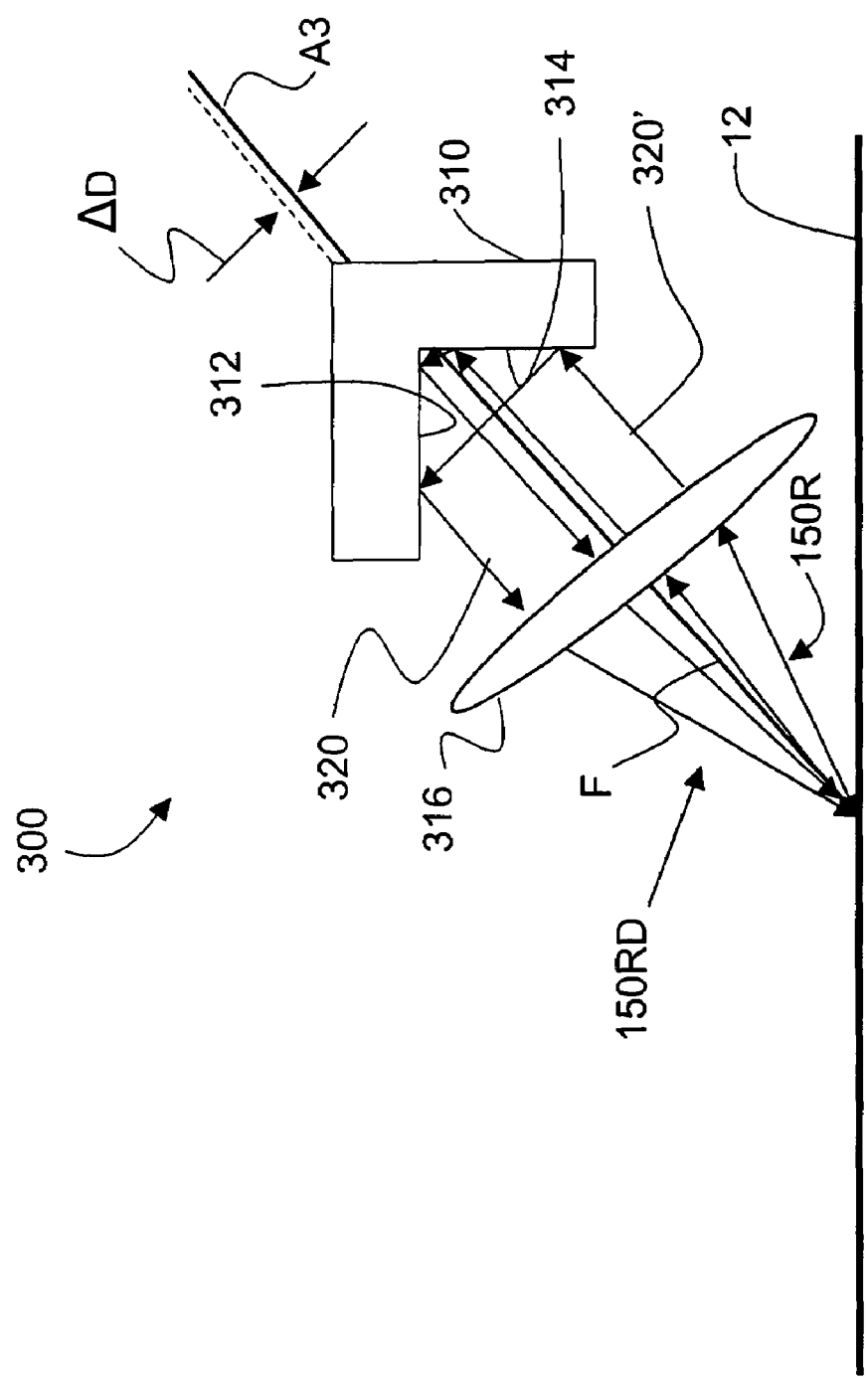
FIG. 15 is a cross-sectional diagram of a variation of the example embodiment illustrated in FIG. 14, wherein corner reflector is displaced (decentered) relative to the axis (A3) by an amount ΔD, resulting in an offset in the angle of incidence between the directly incident and recycled preheating radiation beams.

FIG. 15 is a cross-sectional diagram of a variation of the example embodiment illustrated in FIG. 14, wherein corner cube reflector 310 is displaced (decentered) relative to axis A3 by an amount ΔD. This results in an offset in the angle of incidence at the substrate between reflected preheating radiation beam 150R and recycled preheating radiation beam 150RD. Note that the position of the beam on the substrate remains the same-only the incidence angle changes. A relative offset between the incidence angles of the two beams can be exploited to prevent reflected preheating radiation from traveling back up into preheating radiation source 142 and causing instabilities in the radiation source. In this particular example embodiment, a refractive corner cube that employs total internal reflection does not work because it does not preserve the polarization of the beam.

FIG. 16 is a cross-sectional diagram that includes another example embodiment of recycling optical system 300 that having a collecting/focusing lens 450 and a grating 460 with a grating surface 462. In an example embodiment, lens 450 is a high-resolution, telecentric relay having first and second lenses 470 and 472 and an aperture stop 474 located between the first and second lenses. Further in the example embodiment, the lens has a focal length F1 at the substrate side and a focal length F2 at the grating side, and the lenses are arranged such that substrate surface 12 is located a distance F1 away from lens 470 as measured along axis A3, and grating 460 is located a distance F2 away from lens 472 as measured along the axis A3. Also the two lenses, 470 and 472, are separated by a distance equal to the sum of their two focal lengths.

Grating surface 462 is preferably adapted to optimally diffract the wavelength of radiation in preheating radiation beam 150 and is ruled so that the incident radiation is diffracted to return along the path of incidence. The optimum grating period P is given by $P = n\lambda/2 \sin \theta_G$ where $\lambda$ is the wavelength of the preheating radiation and $\theta_G$ is the angle of incidence onto the grating relative to the grating surface normal $N_G$, and n is the refractive index of the medium surrounding the grating (n=1 for air). The purpose of the grating is to compensate for the tilted focal plane at the substrate, which would otherwise result in the return image being defocused by an amount depending on the distance in the plane of the FIG. 16 between the image point 468 and the axis of the relay 450. Note that in this geometry, where relay 450 operates at $-1X$, $\theta_G = \theta_{150} = \theta_{150R} = \theta_{150RD}$. In general, $\tan \theta_G = M \tan \theta_{150}$ where M is the magnification of relay 450 from the substrate to the grating.

In operation, reflected radiation 150R is collected by telecentric relay 450, which includes lens 470 and lens 472, which brings the radiation to a focus onto grating surface 462. Grating surface 462 redirects (or more precisely, diffracts) the radiation back to relay 450, which directs what is now recycled preheating radiation 150RD back to surface 12 at or near the point 468 where the reflected preheating radiation originated.

A shortcoming with the embodiment of FIG. 16 is that reflected preheating radiation 150R is imaged onto a very small spot on the grating on a continuing basis which could eventually melt or otherwise damage the grating. A similar problem would be encountered using a normal-incidence mirror (not shown) in place of the grating. Therefore, care must be taken in operating apparatus 8 of FIG. 1C using the example embodiment of FIG. 16.

Figure 17:
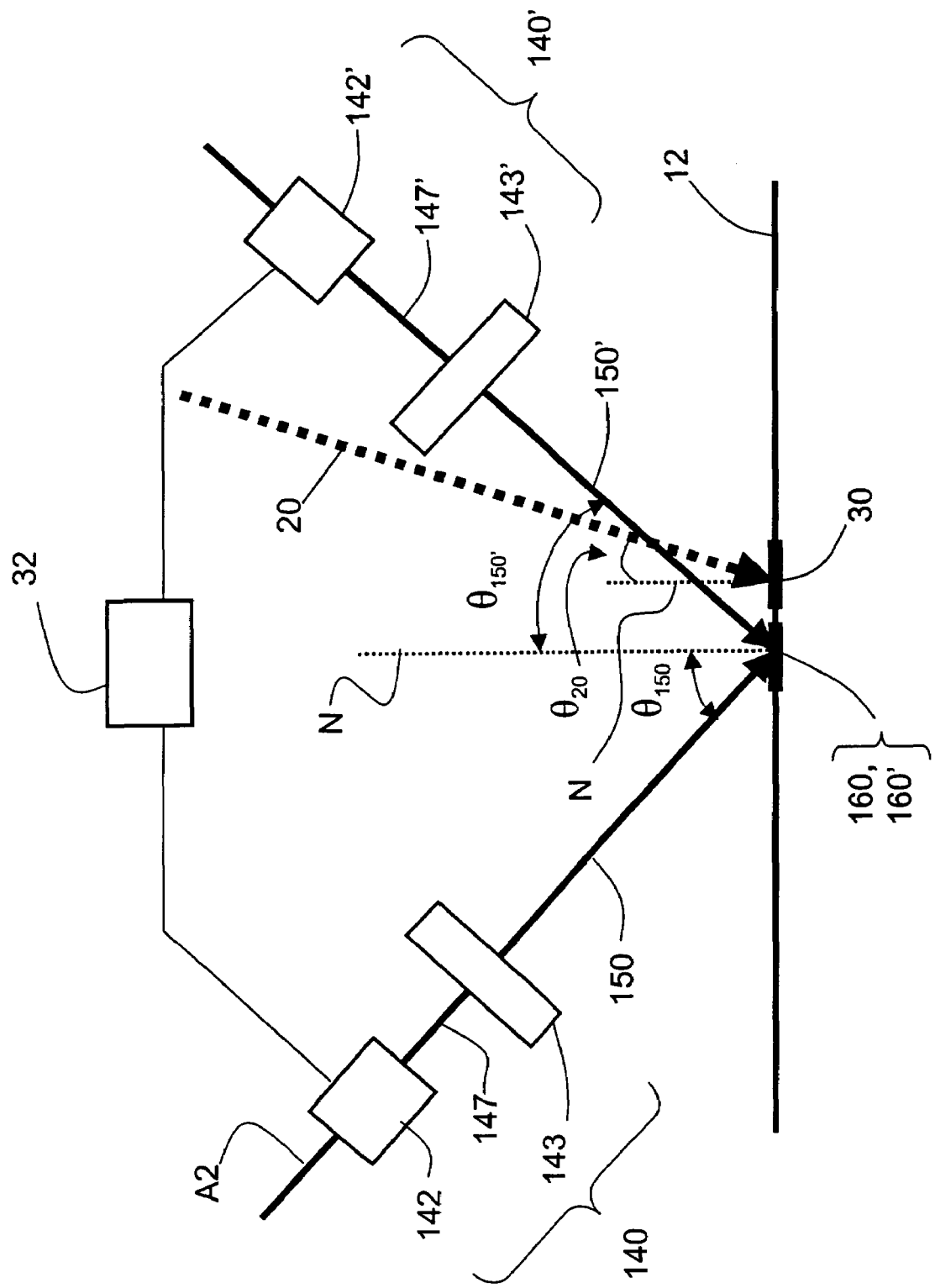
FIG. 17 is a cross-sectional schematic view of an example embodiment of an arrangement for preheating a substrate using two preheating optical relay systems employing similar incidence angles from opposite sides of the substrate normal.

FIG. 17 is a cross-sectional schematic view of an example embodiment of an arrangement for preheating substrate 10 that employs two preheating optical relay systems 140 and 140' having preheating radiation sources 142 and 142', respectively, and emitting preheating radiation beams 150 and 150', respectively, that form images 160 and 160' at the substrate, respectively. In one example embodiment, preheating systems 140 and 140' are arranged such that they each form images 160 and 160' that at least partially overlap with one another at the substrate. Such an arrangement reduces the demands on the preheating radiation sources 142 and 142' to output high-power preheating radiation 147 and 147'. In an example embodiment, preheating radiation sources 142 and 142' are each laser diode arrays. Further in the example embodiment, the laser diode arrays emit radiation at a wavelength of 780 nm–840 nm. Preheating radiation sources 142 and 142' are both operatively connected to controller 32.

In an example embodiment, annealing radiation beam 20 (FIG. 1C) is incident substrate surface 12 at an incident angle $\theta_{20}$ at or near the associated Brewster's angle for silicon (i.e., $\theta_{20} \sim 75°$ at 10.6 μm). The preheating radiation beams 150 and 150' of FIG. 17 are incident at angles $\theta_{150}$ and $\theta_{150'}$ that may be different from the Brewster's angle because of the larger angular spread in the preheat beams. In one example embodiment, incident angles $\theta_{150}$ and $\theta_{150'}$ are equal (e.g., about 52°), while in another example embodiment, incident angles $\dot{e}_{150}$ and $\theta_{150'}$ are different.

In an example embodiment, images 160 and 160' are formed in front of (i.e., ahead of in the direction of scanning) image 30 so that the substrate is preheated prior to the arrival of annealing radiation beam 20 (and its associated image 30) over the preheated portion of the substrate when the beams are scanned relative to substrate surface 12.

The embodiment of FIG. 17 is not limited to two preheating radiation beams 150 and 150'. In general, any reasonable number of preheating radiation beams can be used to form corresponding images on substrate surface 12 to achieve the desired preheating effect.

In the foregoing Detailed Description, various features are grouped together in various example embodiments for ease of understanding. The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

TABLE 1

Lens design data for example embodiment of relay optical system 143 as illustrated in FIGS. 8A and 8B

| s# | Radius (RDY, RDX) | TH | Glass | Element |
|---|---|---|---|---|
| 1 | RDY = RDX = 8 | 3.100 | NBK7 | Lens 202 |
| 2 | RDY = RDX = −142.696 | 0.500 | | |
| 3 | RDY = RDX = 8 | 5.800 | NBK7 | Lens 204 |
| 4 | RDY = −30.060 RDX = 8 | 107.027 | | |
| 6 | RDY = 544.836 RDX = 8 | 7.800 | B270 | Lens 206 |
| 7 | RDY = −47.730 RDX = 8 | 113.564 | | |
| 8 | RDY = 99.955 RDX = 8 | 8.00 | NBK7 | Lens 208 |
| 9 | RDY = 1309.204 RDX = 8 | 52.015 | | |
| 11 | RDY = 8 RDX = 38.835 | 9.900 | NBK7 | Lens 210 |
| 12 | RDY = RDX = 8 | 6.946 | | |
| 13 | RDY = 8 RDX = −199277.3 | 9.600 | NBK7 | Lens 212 |
| 14 | RDY = 8 RDX = −13.079 | 338.951 | | |
| 15 | RDY = RDX = 50.084 | 6.749 | NBK7 | Lens 214 |
| 16 | RDY = RDX = 693.301 | 19.454 | | |
| 17 | RDY = RDX = 21573827 | 3.000 | NBK7 | Lens 216 |
| 18 | RDY = RDX = 34.369 | 5.895 | | |
| 19 | RDY = RDX = 946.3332 | 9.000 | NBK7 | Lens 218 |
| 20 | RDY = RDX = −84.838 | .500 | | |
| 21 | RDY = RDX = 46.343 | 6.370 | Fused Silica | Lens 220 |
| 22 | RDY = RDX = 22.240 | 42.168 | | |
| 23 | RDY = RDX = 4434.483 | 8.000 | Fused Silica | Lens 222 |
| 24 | RDY = RDX = 8 | 21.000 | | |
| | Image Plane | | | |

What is claimed is:

1. An apparatus for preheating a substrate having a surface in order to perform laser thermal annealing of the substrate with an annealing radiation beam that is not substantially absorbed by the substrate at room temperature, the apparatus comprising:
   a preheating radiation source adapted to emit preheating radiation that is substantially absorbed by the substrate at room temperature;
   a relay lens adapted to receive the preheating radiation from said preheating radiation source and form a preheating radiation beam that forms a first image at the substrate, wherein the first image is scanned over the substrate surface to preheat a portion of the surface that is in front of or that partially overlaps with a scanned second image formed by the annealing radiation beam; and
   a recycling optical system arranged to receive preheating radiation reflected from the substrate and direct the reflected preheating radiation back to the substrate as a recycled radiation beam.

2. The apparatus of claim 1, wherein the recycling optical system includes a collecting/focusing lens and a corner cube reflector.

3. The apparatus of claim 2, wherein the recycled radiation beam and the preheating radiation beam have respective incident angles, the recycling optical system has an optical axis, and wherein the corner cube reflector is displaced relative to the optical axis so as to at least partially separate the incidence angles of the recycled and preheating radiation beams.

4. The apparatus of claim 1, wherein the recycling optical system includes a telecentric relay and a diffraction grating.

5. An apparatus for preheating a substrate having a surface in order to perform laser thermal annealing of the substrate with an annealing radiation beam that is not substantially absorbed by the substrate at room temperature, the apparatus comprising:
   first and second preheating optical systems each arranged to irradiate a portion of the substrate with respective first and second preheating radiation beams each having a wavelength that is substantially absorbed by the substrate at room temperature; and
   wherein said first and second preheating radiation beams form respective first and second scanned images that are maintained ahead of a third scanned image formed by the annealing radiation beam when the preheating radiation beams and the annealing radiation beam are scanned relative to the substrate surface.

6. The apparatus of claim 5, wherein first and second preheating radiation beams are p-polarized and intercept the substrate surface at an angle that minimizes variation in absorption from structures present on the substrate surface.

7. The apparatus of claim 5, wherein first and second preheating radiation beams have equal and opposite incident angles.

8. An apparatus for preheating a substrate having a surface in order to perform laser thermal annealing of the substrate with an annealing radiation beam that is not substantially absorbed by the substrate at room temperature, the apparatus comprising:
   multiple preheating optical systems each arranged to irradiate a portion of the substrate with multiple preheating radiation beams each having a wavelength that is substantially absorbed by the substrate at room temperature; and
   wherein said multiple preheating radiation beams form respective images that are maintained ahead of an annealing radiation beam image when the preheating radiation beams and the annealing radiation beam are scanned relative to the substrate surface.

* * * * *